United States Patent
Nakamata et al.

(10) Patent No.: US 10,490,625 B2
(45) Date of Patent: Nov. 26, 2019

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Shin'ichi Nakamata, Matsumoto (JP); Takashi Shiigi, Matsumoto (JP); Yasuyuki Hoshi, Matsumoto (JP); Yuichi Harada, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/941,752

(22) Filed: Mar. 30, 2018

(65) Prior Publication Data

US 2018/0350900 A1    Dec. 6, 2018

(30) Foreign Application Priority Data

May 31, 2017    (JP) ................................ 2017-108596

(51) Int. Cl.
*H01L 29/06* (2006.01)
*H01L 29/16* (2006.01)
(Continued)

(52) U.S. Cl.
CPC .......... *H01L 29/063* (2013.01); *H01L 21/046* (2013.01); *H01L 29/1095* (2013.01);
(Continued)

(58) Field of Classification Search
CPC . H01L 51/56; H01L 27/3246; H01L 51/0072; H01L 51/0097; H01L 51/5253
(Continued)

(56) References Cited

U.S. PATENT DOCUMENTS

| 2003/0107041 A1 | 6/2003 | Tanimoto et al. |
| 2006/0118812 A1 | 6/2006 | Ohtsuka et al. |
| 2017/0141222 A1* | 5/2017 | Harada ............... H01L 29/1095 |

FOREIGN PATENT DOCUMENTS

| JP | 2003-243654 A | 8/2003 |
| JP | 2006-165225 A | 6/2006 |

(Continued)

OTHER PUBLICATIONS

Krishna Shenai et al., "Optimum Semiconductors for High-Power Electronics", IEEE Transactions on Electron Devices, vol. 36, No. 9, pp. 1811-1823, Sep. 1989.
(Continued)

*Primary Examiner* — Andy Huynh
(74) *Attorney, Agent, or Firm* — Rabin & Berdo, P.C.

(57) ABSTRACT

A silicon carbide semiconductor device includes a silicon carbide semiconductor substrate, a first semiconductor layer, a first semiconductor region, a second semiconductor layer, a second semiconductor region, a third semiconductor region, a fourth semiconductor sub-region, a first electrode, a gate insulating film, a gate electrode, and second electrode. At a corner part of an active region in which a main current flows, a fifth semiconductor sub-region is provided. An impurity concentration of the fifth semiconductor sub-region is higher than an impurity concentration of the second semiconductor layer.

8 Claims, 24 Drawing Sheets

(51) Int. Cl.
  *H01L 21/04*      (2006.01)
  *H01L 29/78*      (2006.01)
  *H01L 29/66*      (2006.01)
  *H01L 29/10*      (2006.01)

(52) U.S. Cl.
  CPC .... *H01L 29/1608* (2013.01); *H01L 29/66068* (2013.01); *H01L 29/7811* (2013.01)

(58) Field of Classification Search
  USPC .......................................................... 257/77
  See application file for complete search history.

(56) References Cited

FOREIGN PATENT DOCUMENTS

| | | |
|---|---|---|
| JP | 2010-050147 A | 3/2010 |
| JP | 2015-095578 A | 5/2015 |

OTHER PUBLICATIONS

B. Jayant Baliga, "Silicon Carbide Power Devices", USA, World Scientific Publishing Co., pp. 60-69, Mar. 30, 2006.

\* cited by examiner

|  | RELIABILITY TEST PERIOD | | |
| --- | --- | --- | --- |
|  | 100h | 1000h | 3000h |
| FIRST EMBODIMENT | 8% | 20% | 30% |
| SECOND EMBODIMENT | 0% | 6% | 10% |
| THIRD EMBODIMENT | 0% | 3% | 5% |
| FOURTH EMBODIMENT | 0% | 2% | 5% |
| FIFTH EMBODIMENT | 0% | 2% | 3% |
| CONVENTIONAL EXAMPLE | 70% | 90% | 100% |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2017-108596, filed on May 31, 2017, the entire contents of which are incorporated herein by reference.

BACKGROUND OF THE INVENTION

1. Field of the Invention

Embodiments of the present invention relate to a silicon carbide semiconductor device and a method of manufacturing a silicon carbide semiconductor device.

2. Description of the Related Art

Silicon (Si) has been used as a constituent material of power semiconductor devices that control high voltage and/or large current. There are several types of power semiconductor devices such as bipolar transistors, insulated gate bipolar transistors (IGBTs), metal oxide semiconductor field effect transistors (MOSFETs), etc. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

Nonetheless, there is a strong demand in the market for a large-current, high-speed power semiconductor device. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device having low ON voltage, high-speed characteristics, and high-temperature characteristics (refer to, for example, K. Shenai, et al, "Optimum Semiconductors for High-Power Electronics", IEEE Transactions on Electron Devices, September 1989, Vol. 36, No. 9, pp. 1811-1823).

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. These merits of silicon carbide are similarly common to other semiconductor materials having a bandgap greater than silicon (hereinafter, wide bandgap semiconductor), such as gallium nitride (GaN). Thus, a high-voltage semiconductor device having low resistance can be achieved by using a wide bandgap semiconductor material (refer to, for example, B. Jayant Baliga, "Silicon Carbide Power Devices", USA, World Scientific Publishing Co., 2006.03.30, p. 61).

In such high-voltage semiconductor devices, high voltage is not only applied to an active region in which current flows in an ON state and in which element structures are formed, but high voltage is also applied to an edge termination region that surrounds a periphery of the active region and sustains the breakdown voltage, and electric field concentrates in the edge termination region. The breakdown voltage of a high-voltage semiconductor device is determined by electric field strength and a thickness and an impurity concentration of the semiconductor material, and in this manner, breakdown tolerance which is determined by characteristics specific to the semiconductor material, is equal from the active region to the edge termination region. Therefore, electrical load that exceeds the breakdown tolerance in the edge termination region due to electric field concentration in the edge termination region may be applied, leading to destruction. In other words, the breakdown voltage of a high-voltage semiconductor device is rate limited by the breakdown tolerance at the edge termination region.

Commonly known devices that improve the overall breakdown voltage of a high-voltage semiconductor device by mitigating or distributing the electric field of the edge termination region include devices in which a voltage breakdown structure such as a junction termination extension (JTE) structure and a field limiting ring (FLR) structure is arranged in the edge termination region (for example, refer to Japanese Laid-Open Patent Publication Nos. 2010-50147 and 2006-165225). Further, a commonly known semiconductor device has, as a field plate (FP), a floating metal electrode in contact with a FLR and releases charge generated at the edge termination region to thereby improve reliability (for example, refer to Japanese Laid-Open Patent Publication No. 2010-50147).

A breakdown voltage structure of a conventional high-voltage silicon carbide semiconductor device will be described taking, as an example, a MOSFET provided with a JTE structure. FIG. 22 is a cross-sectional view of a structure of a corner part of a conventional silicon carbide semiconductor device depicted in FIG. 25, the cross-sectional view is along cutting line A-A' in FIG. 25. FIG. 23 is a cross-sectional view of the structure of the corner part of the conventional silicon carbide semiconductor device depicted in FIG. 25, the cross-sectional view is along cutting line B-B' in FIG. 25. FIG. 24 is a cross-sectional view of the structure of the corner part of the conventional silicon carbide semiconductor device depicted in FIG. 25, the cross-sectional view is along cutting line C-C' in FIG. 25. FIG. 25 is a top view of the structure of the corner part of the conventional silicon carbide semiconductor device.

The conventional silicon carbide semiconductor device depicted in FIGS. 22 to 25 has on a semiconductor base (hereinafter, silicon carbide base (semiconductor chip)) containing silicon carbide, an active region 201, an edge termination region 202 surrounding a periphery of the active region 201, and a gate runner region 203 in which a gate runner is provided, connecting a gate electrode 207 and a gate pad electrode. The silicon carbide base is formed by stacking sequentially on a front surface of an $n^+$-type supporting substrate (hereinafter, $n^+$-type silicon carbide substrate) 201 containing silicon carbide, an $n^-$-type semiconductor layer (hereinafter, $n^-$-type silicon carbide layer) 202 containing silicon carbide, and a p-type semiconductor layer (hereinafter, p-type silicon carbide layer) 2011 containing silicon carbide.

In the active region 201, a MOS gate (insulated gate constituted by a metal oxide film semiconductor) of a planar structure is provided on a front surface of the silicon carbide base (surface of the p-type silicon carbide layer 2011). The p-type silicon carbide layer 2011 is removed in the entire edge termination region 202. In the front surface of the silicon carbide base, a step is formed thereby making the edge termination region 202 lower than the active region 201 (recessed toward a drain) and exposing the n$^-$-type silicon carbide layer 202 at a bottom of the step. Further, in the edge termination region 202, a JTE structure is provided in which plural p$^+$-type regions (here, two p$^+$-type regions, including a JTE1 region 2031 and a JTE2 region 2032) are arranged adjacent to each other. On an outer side (side toward the chip edge) of the JTE structure, an n$^+$-type semiconductor region (not depicted) functioning as a channel stopper is provided.

The JTE1 region 2031 and the JTE2 region 2032 are each selectively provided in a part of the n$^-$-type silicon carbide layer 202 exposed at the bottom of the step. When high voltage is applied, the high voltage in a horizontal direction other than in the active region 201 is secured by a pn junction between the n$^-$-type silicon carbide layer 202 and the JTE1 region 2031, the JTE2 region 2032. A drain electrode 209 in contact with a rear surface (rear surface of the n$^+$-type silicon carbide substrate 201) of the silicon carbide base is provided. Further, the conventional high-voltage semiconductor device includes a p$^+$-type base region 2010, an n-type well region 2012, an n$^+$-type source region 204, a p$^+$-type contact region 205, a gate insulating film 206, the gate electrode 207, an interlayer insulating film 2014, a source electrode 208, a field oxide film 2013, and a surface protecting film 2015.

In the MOSFET configured as depicted in FIGS. 22 to 25, when relative to the source electrode 208, positive voltage is applied to the drain electrode 209 and voltage lower than the gate threshold voltage is applied to the gate electrode 207, the pn junction between the p-type base region and the n-type well region 2012 is reverse biased and therefore, reverse breakdown voltage of the active region 201 is secured and current does not flow. The p-type base region is a part of the p-type silicon carbide layer 2011 other than the n$^+$-type source region 204 and the p$^+$-type contact region 205.

On the other hand, when voltage equal to or higher than the gate threshold voltage is applied to the gate electrode 207, an n-type inversion layer (channel) is formed in a surface layer of the p-type base region at a part where the gate electrode 207 is provided. As a result, current flows along a path including the n$^+$-type silicon carbide substrate 201, the n$^-$-type silicon carbide layer 202, the n-type well region 2012, the surface inversion layer of the p-type base region and the n$^+$-type source region 204. In this manner, suppression of the gate voltage enables the known switching operation of a MOSFET to be performed.

SUMMARY OF THE INVENTION

According to an embodiment of the present invention, a silicon carbide semiconductor device includes a silicon carbide semiconductor substrate of a first conductivity type; a first semiconductor layer of the first conductivity type provided on a front surface of the silicon carbide semiconductor substrate, an impurity concentration of the first semiconductor layer being lower than an impurity concentration of the silicon carbide semiconductor substrate; a first semiconductor region of a second conductivity type selectively provided in a surface of the first semiconductor layer; a second semiconductor layer provided on the surface of the first semiconductor layer and a surface of the first semiconductor region, the second semiconductor layer including a first semiconductor sub-region of the second conductivity type, a second semiconductor sub-region of the first conductivity type selectively provided on the first semiconductor layer, in the second semiconductor layer, and third semiconductor sub-regions of the first conductivity type selectively provided in the second semiconductor layer; a fourth semiconductor sub-region of the second conductivity type provided between the third semiconductor sub-regions in the second semiconductor layer, an impurity concentration of the fourth semiconductor sub-region being higher than an impurity concentration of the first sub-region of the second semiconductor layer; a first electrode electrically connected to the third semiconductor sub-regions and the fourth semiconductor sub-region; a gate insulating film provided on a surface of the second semiconductor layer between the third semiconductor sub-region and the second semiconductor sub-region; a gate electrode provided on the gate insulating film; and a second electrode provided on a rear surface of the silicon carbide semiconductor substrate. The impurity concentration of the first sub-region of the second semiconductor layer is at most $5\times10^{16}$/cm$^3$, and a fifth semiconductor sub-region of the second conductivity type is provided at a corner part of an active region in which a main current flows, an impurity concentration of the fifth semiconductor sub-region being higher than the impurity concentration of the first semiconductor sub-region of the second semiconductor layer.

In the embodiment, the silicon carbide semiconductor device further includes a sixth semiconductor sub-region in contact with a part of the fifth semiconductor sub-region, the part of the fifth semiconductor sub-region facing toward an edge termination region that surrounds a periphery of the active region.

In the embodiment, the fifth semiconductor sub-region is in contact with the fourth semiconductor sub-region, at the corner part of the active region.

In the embodiment, the gate insulating film is provided on a surface of the fourth semiconductor sub-region, at the corner part of the active region.

In the embodiment, the gate electrode is insulated from the second semiconductor layer and the fifth semiconductor sub-region by a field oxide film, at the corner part of the active region.

A method of manufacturing a silicon carbide semiconductor device, includes forming a first semiconductor layer of a first conductivity type on a front surface of a silicon carbide semiconductor substrate of the first conductivity type, an impurity concentration of the first semiconductor layer being lower than an impurity concentration of the silicon carbide semiconductor substrate; selectively forming a first semiconductor region of a second conductivity type in a surface of the first semiconductor layer; forming a second semiconductor layer of the second conductivity type on the surface of the first semiconductor layer and a surface of the first semiconductor region, an impurity concentration of the second semiconductor layer being at most $5\times10^{16}$/cm$^3$; selectively forming a second semiconductor sub-region of the first conductivity type on the first semiconductor layer, in the second semiconductor layer, to form a first sub-region of the second conductivity type and the second semiconductor sub-region of the first conductivity type in the second semiconductor layer; selectively forming third semiconductor sub-regions of the first conductivity type in the second semiconductor layer; forming a fourth semiconductor sub-region of the second conductivity type between the third semiconductor sub-regions in the second semiconductor layer, an impurity concentration of the fourth semiconductor sub-region being higher than an impurity concentration of the first sub-region of the second semiconductor layer; forming a first electrode electrically connected to the third semiconductor sub-regions and the fourth semiconductor sub-region; forming a gate insulating film on a surface of the second semiconductor layer between the third semiconductor region and the second semiconductor region; forming a gate electrode on the gate insulating film; and forming a second electrode on a rear surface of the silicon carbide semiconductor substrate. Forming the fourth semiconductor sub-region includes forming a fifth semiconductor sub-region of the second conductivity type at a corner part of an active region in which a main current flows, an impurity concentration of the fifth semiconductor sub-region being higher than the impurity concentration of the first sub-region of the second semiconductor layer.

Other objects, features, and advantages of the present invention are specifically set forth in or will become apparent from the following detailed description of the invention when read in conjunction with the accompanying drawings.

DETAILED DESCRIPTION OF THE INVENTION

Figure 22:
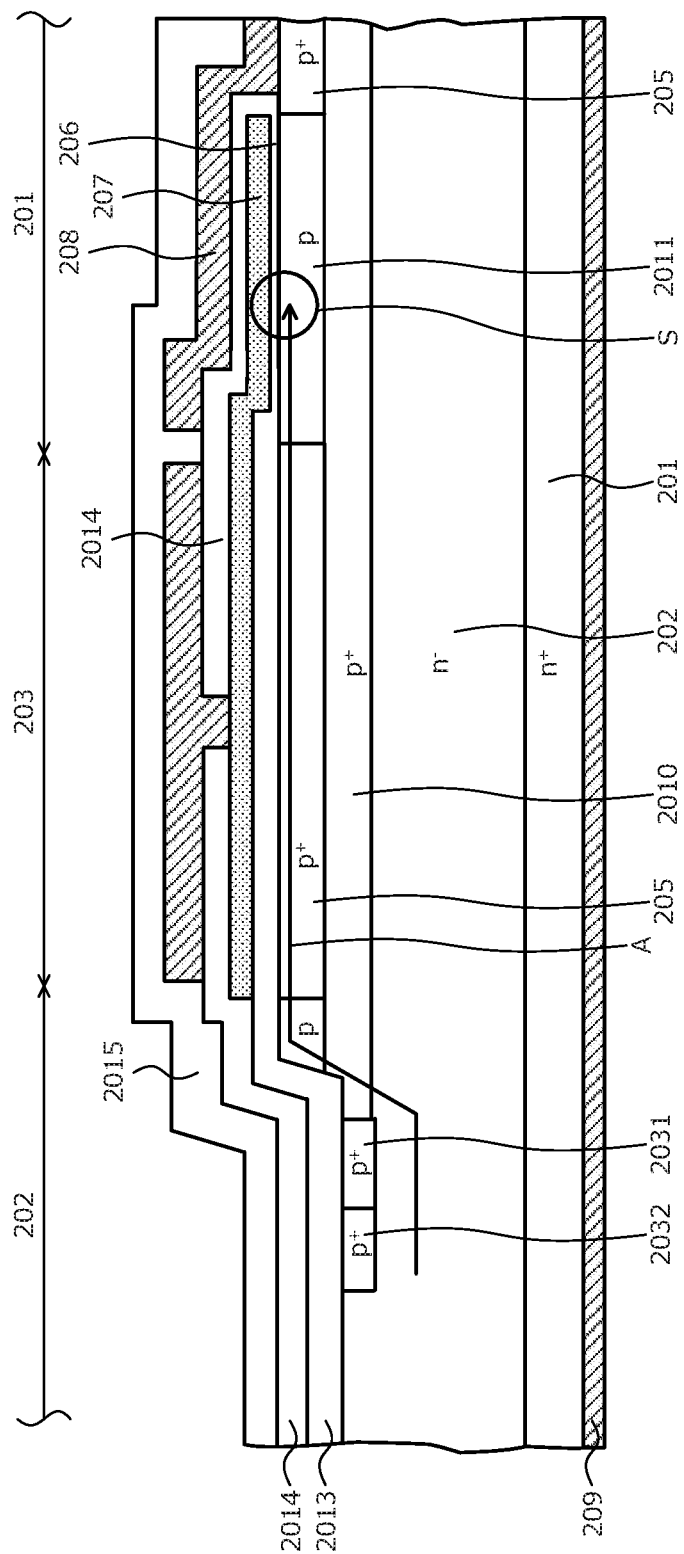
FIG. 22 is a cross-sectional view of a structure of a corner part of a conventional silicon carbide semiconductor device depicted in FIG. 25, the cross-sectional view is along cutting line A-A' in FIG. 25.
Figure 23:
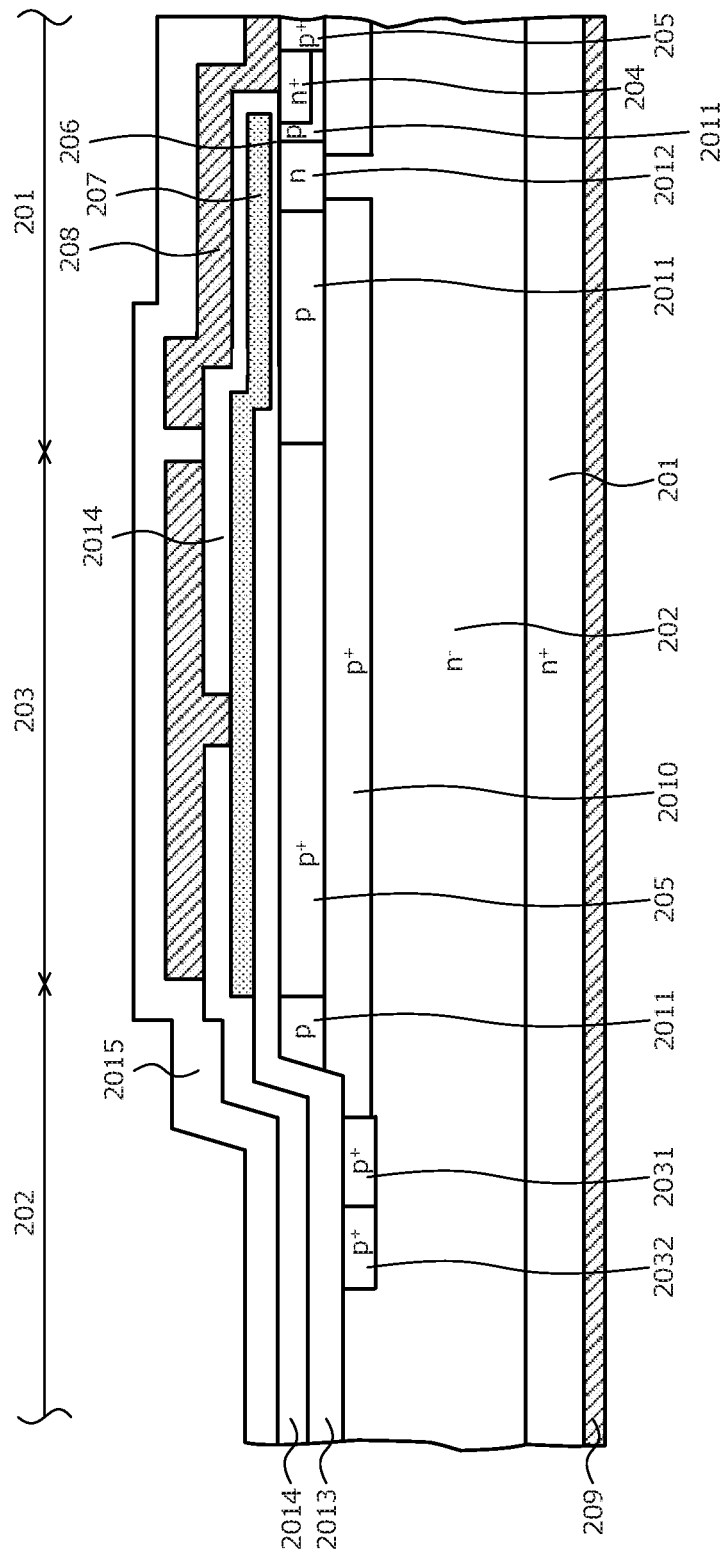
FIG. 23 is a cross-sectional view of the structure of the corner part of the convention silicon carbide semiconductor device depicted in FIG. 25, the cross-sectional view is along cutting line B-B' in FIG. 25.
Figure 24:
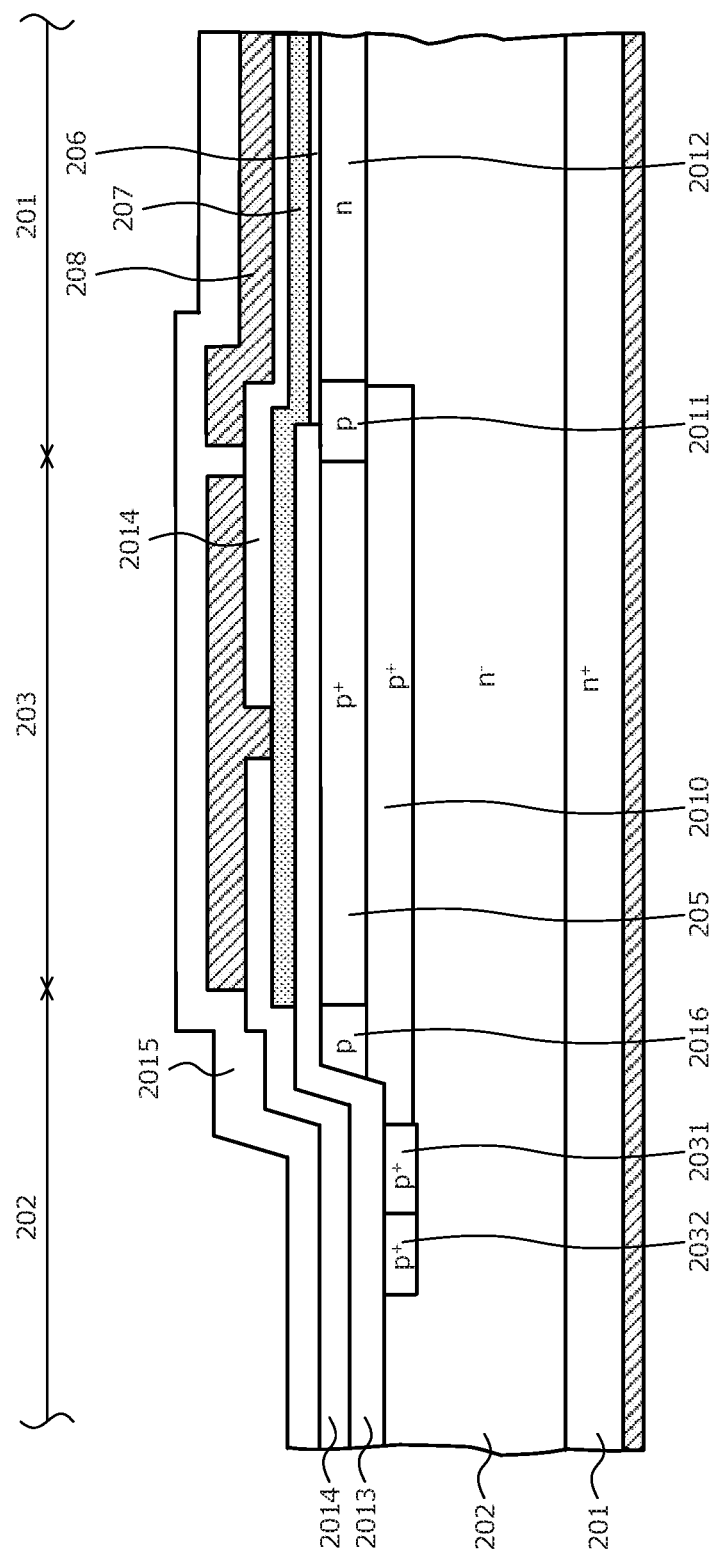
FIG. 24 is a cross-sectional view of the structure of the corner part of the convention silicon carbide semiconductor device depicted in FIG. 25, the cross-sectional view is along cutting line C-C' in FIG. 25.
Figure 25:
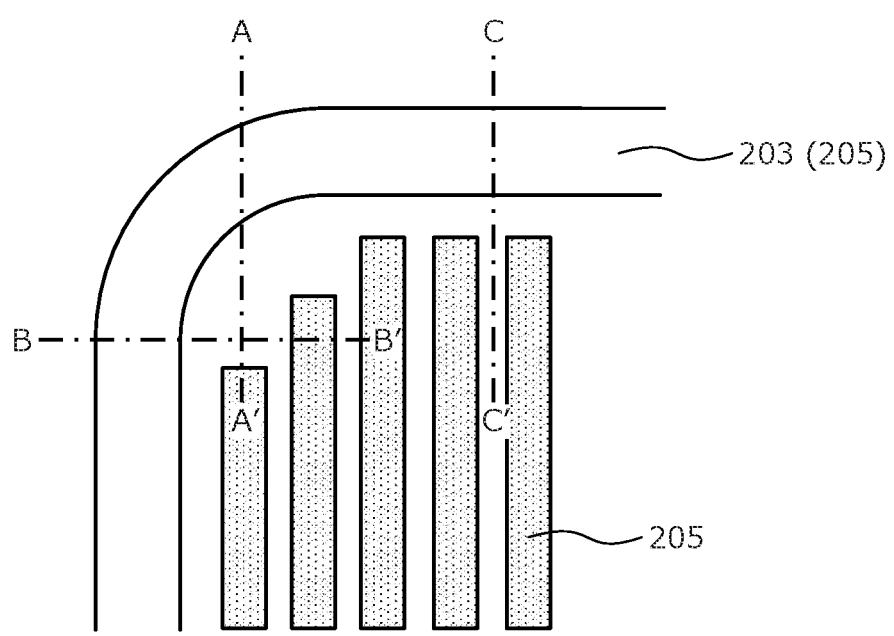
FIG. 25 is a top view of the structure of the corner part of the conventional silicon carbide semiconductor device.

First, problems related to the conventional techniques will be discussed. When a reliability test such as temperature/humidity bias (THB) is performed with respect to the conventional silicon carbide semiconductor device, a phenomenon occurs where destruction concentrates and occurs at the gate insulating film 206 (for example, a location indicated by reference character S in FIG. 22) constituted by an oxide film between the p-type silicon carbide layer 2011, which has a high resistance, and the gate electrode 207 around the element. This destruction occurs mainly at a corner part around the element. The corner part is a part of the active region 201 in contact with four corners of a semiconductor element, and a top of one corner part of the silicon carbide semiconductor device is depicted in FIG. 25.

It is thought that charge (holes) generated at the edge termination region 202 flows to the p-type silicon carbide layer 2011 and the p$^+$-type contact region 205 (flow indicated by arrow A in FIG. 22), whereby electric field is applied to the oxide film between the p-type silicon carbide layer 2011, which has a high resistance, and the gate electrode 207 around the element, causing dielectric breakdown.

Thus, in the MOSFET having the structure depicted in FIGS. 22 to 25, an impurity concentration of a p$^+$-type base layer 2010 is set high to suppress punch-through, or the p-type silicon carbide layer 2011 is formed to secure high channel mobility. Therefore, since the n-type well region 2012 is formed by inverting the JFET region from a p-type to an n-type by ion implantation, an impurity concentration of the p-type silicon carbide layer 2011 cannot be increased and the resistance becomes high. In particular, at the corner parts around the element where current tends to concentrate, the part where the p-type silicon carbide layer 2011 is provided becomes longer and destruction concentrates and occurs here. In this structure, due to the corner parts near the element where concentration tends to occur, current unnecessarily flows to a body-diode.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or – appended to n or p means that the impurity concentration is higher or lower, respectively, than layers and regions without + or –. Cases where symbols such as n's and p's that include + or – are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "–" means a bar added to an index immediately after the "–", and a negative index is expressed by prefixing "–" to the index.

Figure 1:
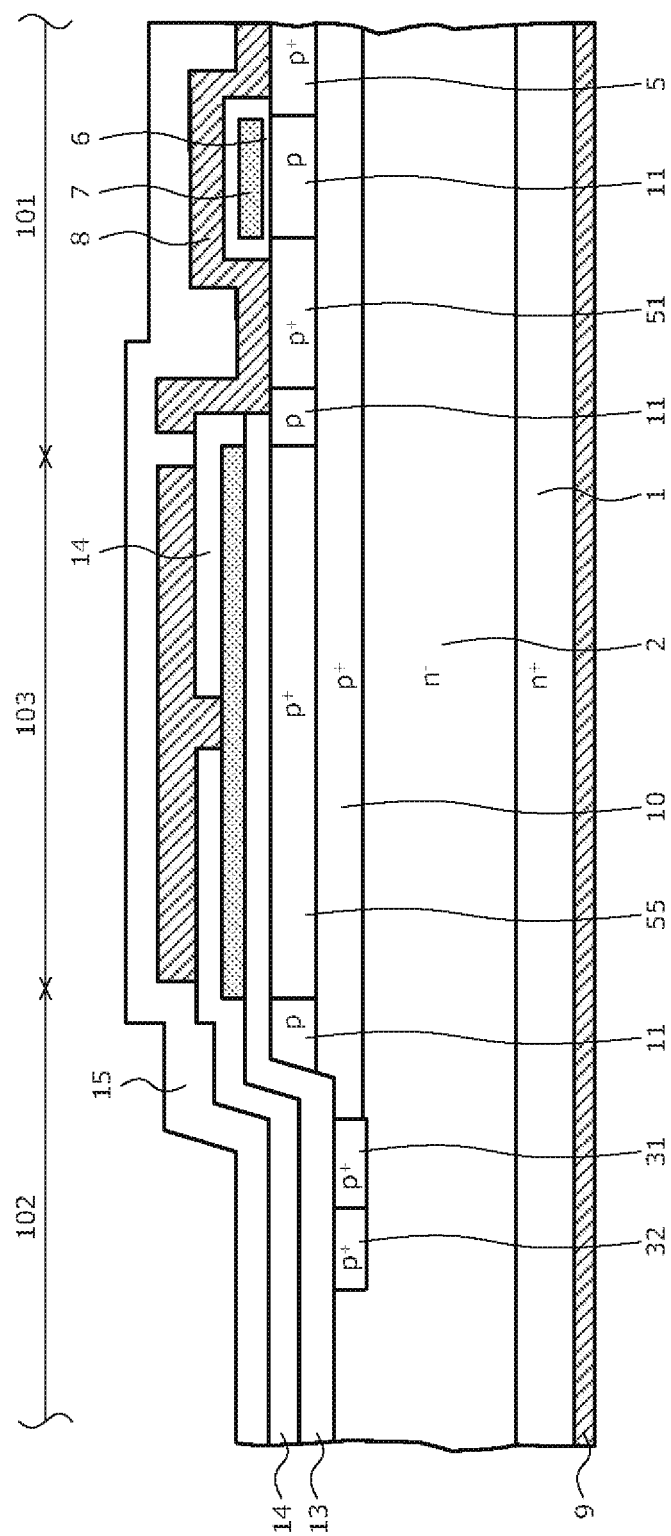
FIG. 1 is a cross-sectional view of a structure of a corner part of a silicon carbide semiconductor device according to a first embodiment depicted in FIG. 4, the cross-sectional view is along cutting line A-A' in FIG. 4.
Figure 2:
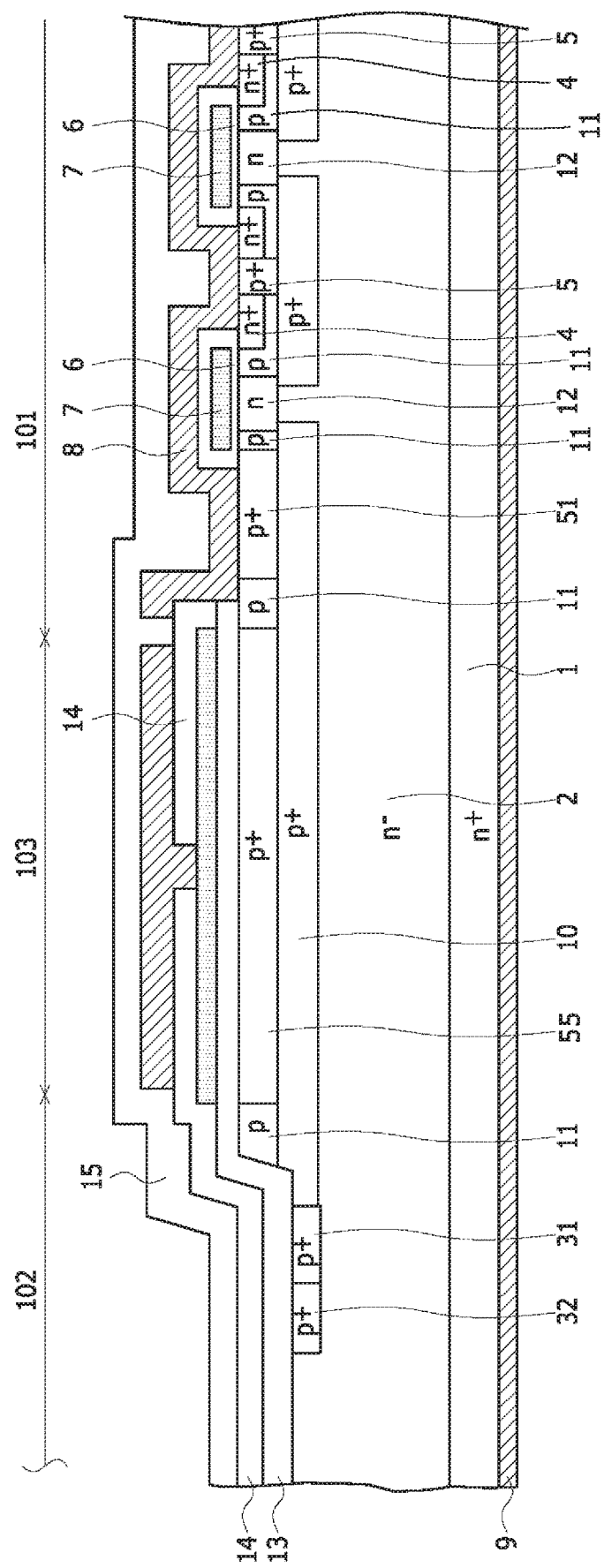
FIG. 2 is a cross-sectional view of the structure of the corner part of the silicon carbide semiconductor device according to the first embodiment depicted in FIG. 4, the cross-sectional view is along cutting line B-B' in FIG. 4.
Figure 3:
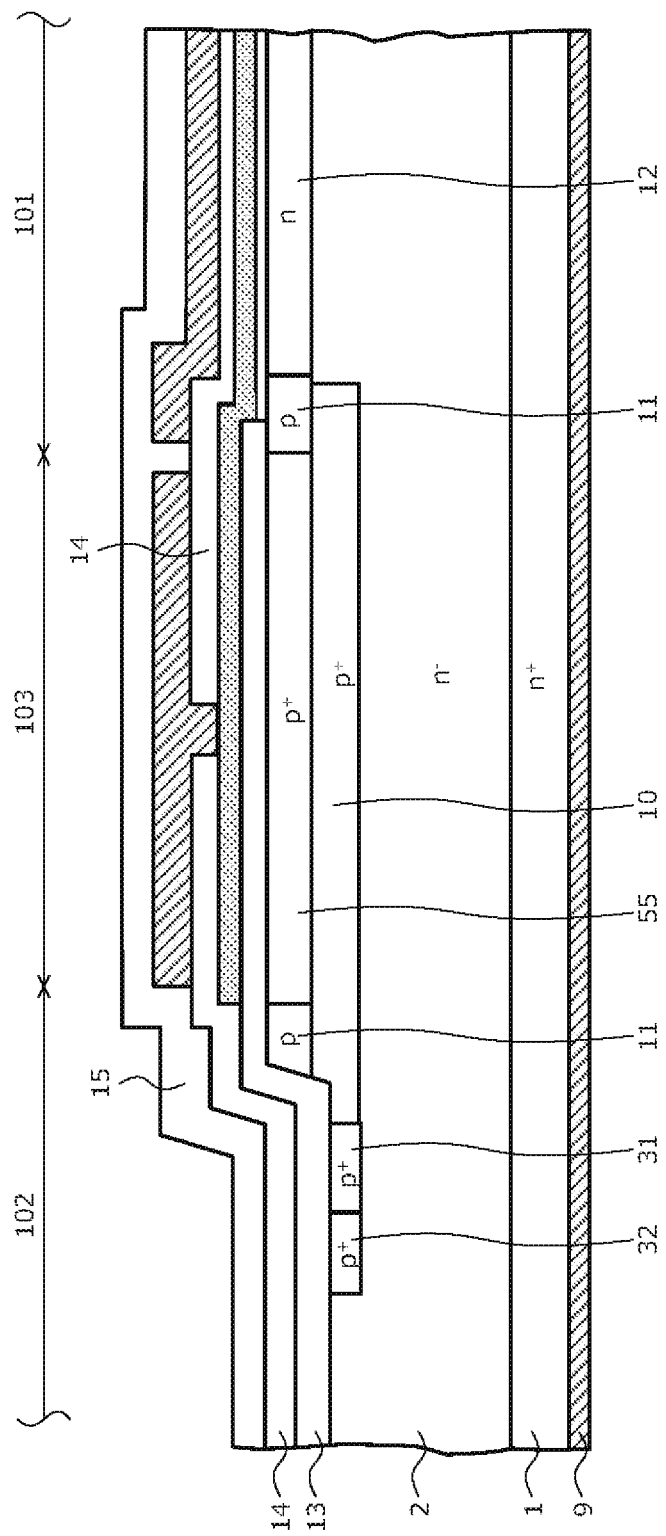
FIG. 3 is a cross-sectional view of the structure of the corner part of the silicon carbide semiconductor device according to the first embodiment depicted in FIG. 4, the cross-sectional view is along cutting line C-C' in FIG. 4.
Figure 4:
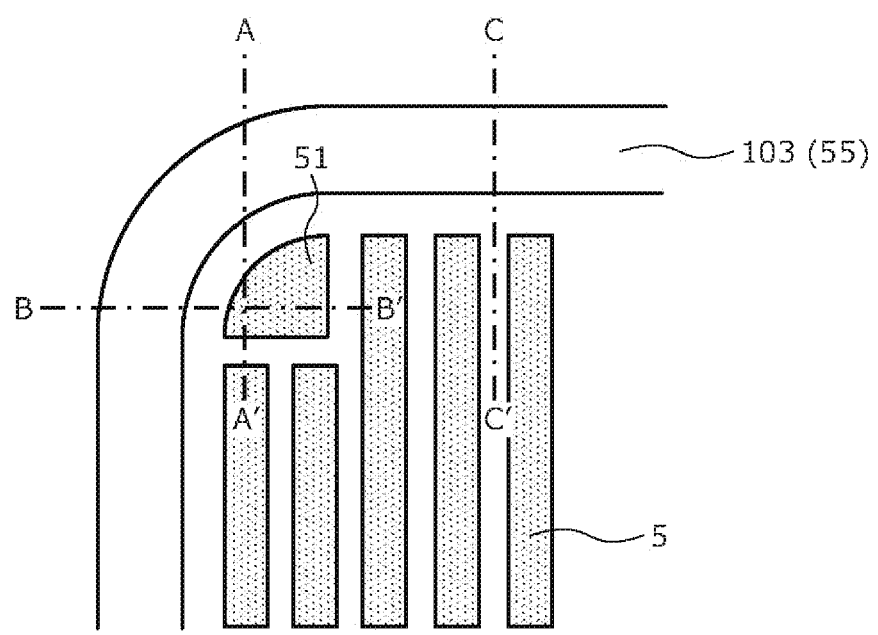
FIG. 4 is a top view of the structure of the corner part of the silicon carbide semiconductor device according to the first embodiment.

The semiconductor device is configured using a wide bandgap semiconductor material. In a first embodiment, a MOSFET will be described as an example of the silicon carbide semiconductor device fabricated using, for example, silicon carbide (SiC) as a wide bandgap semiconductor material. FIG. 1 is a cross-sectional view of a structure of a corner part of the silicon carbide semiconductor device according to the first embodiment depicted in FIG. 4, the cross-sectional view is along cutting line A-A' in FIG. 4. FIG. 2 is a cross-sectional view of the structure of the corner part of the silicon carbide semiconductor device according to the first embodiment depicted in FIG. 4, the cross-sectional view is along cutting line B-B' in FIG. 4. FIG. 3 is a cross-sectional view of the structure of the corner part of the silicon carbide semiconductor device according to the first embodiment depicted in FIG. 4, the cross-sectional view is along cutting line C-C' in FIG. 4. FIG. 4 is a top view of the structure of the corner part of the silicon carbide semiconductor device according to the first embodiment.

As depicted in FIGS. 1 to 3, the semiconductor device according to the first embodiment has on a semiconductor base (hereinafter, silicon carbide base (semiconductor substrate (semiconductor chip))) containing silicon carbide, an active region 101, an edge termination region 102 surrounding a periphery of the active region 101, and a gate runner region 103 in which a gate runner is provided connecting a gate electrode 7 and a gate pad electrode. The active region 101 is a region in which current flows in an ON state. The edge termination region 102 is a region that mitigates electric field of a base front surface side of a drift region and sustains breakdown voltage.

A silicon carbide base is formed by stacking sequentially on a front surface of an n$^+$-type supporting substrate (n$^+$-type silicon carbide substrate, silicon carbide semiconductor substrate) 1 of a first conductivity type and containing silicon carbide, an n$^-$-type semiconductor layer (n$^-$-type silicon carbide layer, first semiconductor layer of the first conductivity type) 2 and containing silicon carbide, and a p-type semiconductor layer (p-type silicon carbide layer, second semiconductor layer of a second conductivity type) 11 containing silicon carbide. While the p-type semiconductor layer 11 is described here as being a second semiconductor layer of a second conductivity type, during processing, various regions of varying conductivity types and impurity concentrations are formed in the semiconductor layer 11. Accordingly, in the claims that follow, the combination of the various regions formed in the p-type semiconductor layer 11 are together described as the "second semiconductor layer," and the portion of the p-type semiconductor layer that is not altered by the implantation of additional materials to change the conductivity type or impurity concentration (corresponding to the reference numeral 11 in FIG. 2) is described as a first sub-region of the second semiconductor layer. The n$^+$-type silicon carbide substrate 1 functions as a drain region. On a rear surface (rear surface of the n$^+$-type silicon carbide substrate 1) of the silicon carbide base, a drain electrode (second electrode) 9 is provided.

In the active region 101, in a surface layer on a first side (base front surface side) of the n$^-$-type silicon carbide layer 2, opposite a second side of the n$^-$-type silicon carbide layer 2, the second side facing the n$^+$-type silicon carbide substrate 1, a p$^+$-type base region (first semiconductor region of the second conductivity type) 10 functioning as a p-type base layer is selectively provided. The p$^+$-type base region 10, for example, is formed by doping aluminum.

On surfaces of adjacent p$^+$-type base regions 10, and on a surface of the n$^-$-type silicon carbide layer 2 between the adjacent p$^+$-type base regions 10, the p-type silicon carbide layer 11 functioning as a p-type base layer is selectively deposited. The p-type silicon carbide layer 11 extends into the edge termination region 102 from the active region 101 and is further deposited on top of the edge termination region 102. An impurity concentration of the p-type silicon carbide layer 11 is at most $5\times10^{16}$/cm$^3$, is lower than an impurity concentration of the p$^+$-type base region 10, and in particular, may be $1\times10^{15}$ to $5\times10^{16}$/cm$^3$. The p-type silicon carbide layer 11, for example, is formed by doping aluminum.

In a part of the p-type silicon carbide layer 11 on the p$^+$-type base region 10, an n$^+$-type source region (third semiconductor sub-region of the first conductivity type) 4 and a p$^+$-type contact region (fourth semiconductor sub-region of the second conductivity type) 5 are provided. Further, the n$^+$-type source region 4 and the p$^+$-type contact region 5 are in contact with each other. The p$^+$-type contact region 5 is arranged closer than the n$^+$-type source region 4 to the edge termination region 102.

A p$^+$-type region (fifth semiconductor sub-region of the second conductivity type) 51 is provided at a corner part of the active region 101 to pull out charge. An impurity concentration of the p$^+$-type region 51 is about a same as that of the p$^+$-type contact region 5 and higher than that of the p-type silicon carbide layer 11. Here, the corner part of the active region 101 is a part of the active region 101 in contact with four corners of a semiconductor element, and in particular, is the part of the active region 101 depicted in FIG. 4.

The p$^+$-type region 51, for example, is provided in a fan-shape at the corner part of the semiconductor element as depicted in FIG. 4. The p$^+$-type region 51 is electrically connected to a source electrode 8 so as to enable charge (holes) generated at the edge termination region 102 to be pulled out to the source electrode 8.

In this manner, a structure that pulls out charge is provided at the corner parts of the semiconductor element, resulting in a structure in which a length of the p-type silicon carbide layer 11 that has high resistance may be shortened and in which electric field applied to the oxide film between the p-type silicon carbide layer 11 the gate electrode 7 around the element is reduced, whereby an occurrence of dielectric breakdown is prevented, enabling reliability to be improved. Furthermore, since the length of the p-type silicon carbide layer 11 having a high resistance is shortened, ON resistance of the semiconductor device is reduced and current flowing unnecessarily to a body-diode in the semiconductor device is reduced, reliability improves.

In a part of the p-type silicon carbide layer 11 on the n$^-$-type silicon carbide layer 2, an n-type well region (second semiconductor sub-region of the first conductivity type) 12 is provided that penetrates the p-type silicon carbide layer 11 in a depth direction and reaches the n$^-$-type silicon carbide layer 2. The n-type well region 12 forms a drift region together with the n$^-$-type silicon carbide layer 2. On a surface of the p-type silicon carbide layer 11 at a part of the p-type silicon carbide layer 11 between the n$^+$-type source region 4 and the n-type well region 12, the gate electrode 7 is provided via a gate insulating film 6. The gate electrode 7 may be provided on a surface of the n-type well region 12 via the gate insulating film 6.

An interlayer insulating film 1 is provided on the entire front surface side of the silicon carbide base so as to cover the gate electrode 7. The source electrode (first electrode) 8 is in contact with the n$^+$-type source region 4 and the p$^+$-type contact region 5, via a contact hole opened in the interlayer insulating film 14. The source electrode 8 is electrically insulated from the gate electrode 7 by the interlayer insulating film 14. In the edge termination region 102, a surface protecting film 15 such a passivation film containing, for example, a polyimide is provided so as to cover the source electrode 8. The surface protecting film 15 has a function of preventing discharge.

In the edge termination region 102, in the surface layer on the first side (base front surface side) of the n$^-$-type silicon carbide layer 2, opposite the second side facing the n$^+$-type silicon carbide substrate 1, plural p$^+$-type regions (in FIGS. 1 to 3, two p$^+$-type regions: the JTE1 region 31 and the JTE2 region 32) sandwiching the p$^+$-type base regions 10 and surrounding the active region 101 are provided. A width of the p$^+$-type base region 10 increases with increasing distance from the active region 101. Impurity concentrations of the JTE1 region 31 and the JTE2 region 32 may be equal to an impurity concentration of the p$^+$-type base region 10 functioning as a p-type base region.

In FIGS. 1 to 3, although a structure in which one MOS gate (insulated gate constituted by a metal oxide film semiconductor) is in the active region 101, further MOS gate structures may be arranged in parallel.

The method of manufacturing the silicon carbide semiconductor device according to the first embodiment will be described taking, as an example, a case in which, for example, a 1200V MOSFET is fabricated. FIGS. 5, 6, 7, and 8 are cross-sectional views of the silicon carbide semiconductor device according to the first embodiment during manufacture. In FIGS. 5 to 8, only cross-sections of parts corresponding to FIG. 2 are depicted.

First, the n$^+$-type silicon carbide substrate (semiconductor wafer) 1 containing a single crystal silicon carbide and doped with an n-type impurity (dopant) such as nitrogen (N) to have an impurity concentration of, for example, $2.0-10^{19}/cm^3$ is prepared. The front surface of the n$^+$-type silicon carbide substrate 1 may be a (0001) plane having, for example, an off axis of about 4 degrees in a crystal axis direction <11–20>. Next, on the front surface of the n$^+$-type silicon carbide substrate 1, the n$^-$-type silicon carbide layer 2 doped with an n-type impurity such as nitrogen to have an impurity concentration of, for example, $1.0\times10^{16}/cm^3$ is formed by epitaxial growth to a thickness of, for example, 10 μm.

Figure 5:
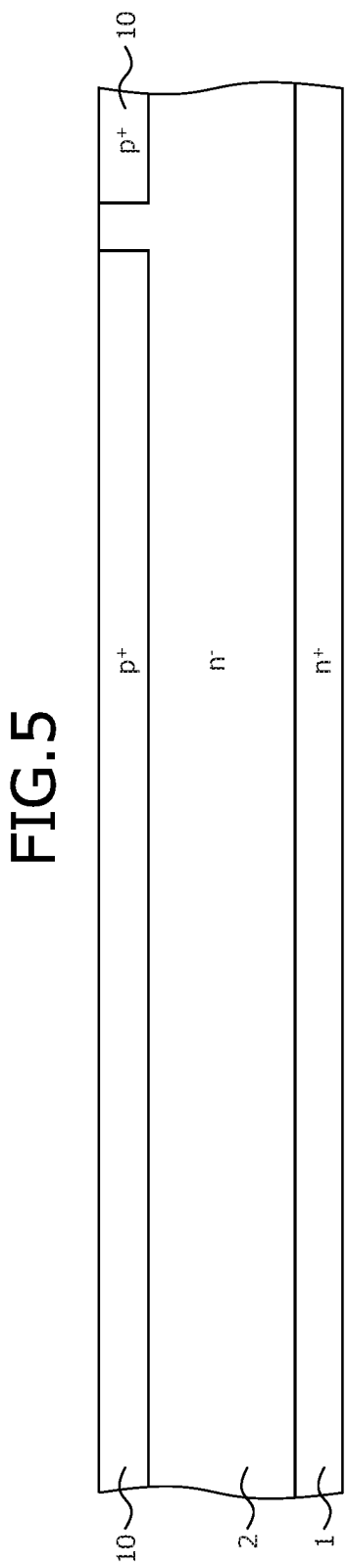
FIG. 5 is a cross-sectional view of the silicon carbide semiconductor device according to the first embodiment during manufacture.

Next, by photolithography and ion implantation, in the surface layer of the n$^-$-type silicon carbide layer 2, the p$^+$-type base region 10 of the edge termination region 102 and the p$^+$-type base region 10 of the active region 101 are selectively formed. In the ion implantation, a p-type impurity (dopant) such as aluminum (Al) may be implanted to achieve a concentration of, for example, $1\times10^{18}/cm^3$. A width and a depth of the p$^+$-type base region 10 may be 13 μm and 0.5 μm, respectively. A distance between the p$^+$-type base regions 10 may be, for example, 2 μm. The state up to here is depicted in FIG. 5.

Next, on the surface of the n$^-$-type silicon carbide layer 2, a p-type silicon carbide epitaxial layer (hereinafter, the p-type silicon carbide layer 11) constituting the p-type silicon carbide layer 11 is formed by epitaxial growth to have a thickness of, for example, 0.5 μm. At this time, for example, the p-type silicon carbide epitaxial layer may be formed by epitaxial growth and doped with a p-type impurity such as aluminum so that an impurity concentration of the p-type silicon carbide layer 11 is $2.0\times10^{16}/cm^3$.

Next, by photolithography and ion implantation, a conductivity type of a part of the p-type silicon carbide layer 11 on the n$^-$-type silicon carbide layer 2 is inverted to selectively form the n-type well region 12. In the ion implantation, an n-type impurity (dopant) such as nitrogen may be doped to achieve a concentration of, for example, $5.0\times10^{16}/cm^3$. A width and a depth of the n-type well region 12 may be 2.0 μm and 0.6 μm, respectively.

Next, by photolithography and ion implantation, the n$^+$-type source region 4 is selectively formed in the surface layer of a part of the p-type silicon carbide layer 11 on the p$^+$-type base region 10. Next, by photolithography and ion implantation, the p$^+$-type contact region 5 is selectively formed in the surface layer of a part of the p-type silicon carbide layer 11 on the p$^+$-type base region 10.

Figure 6:
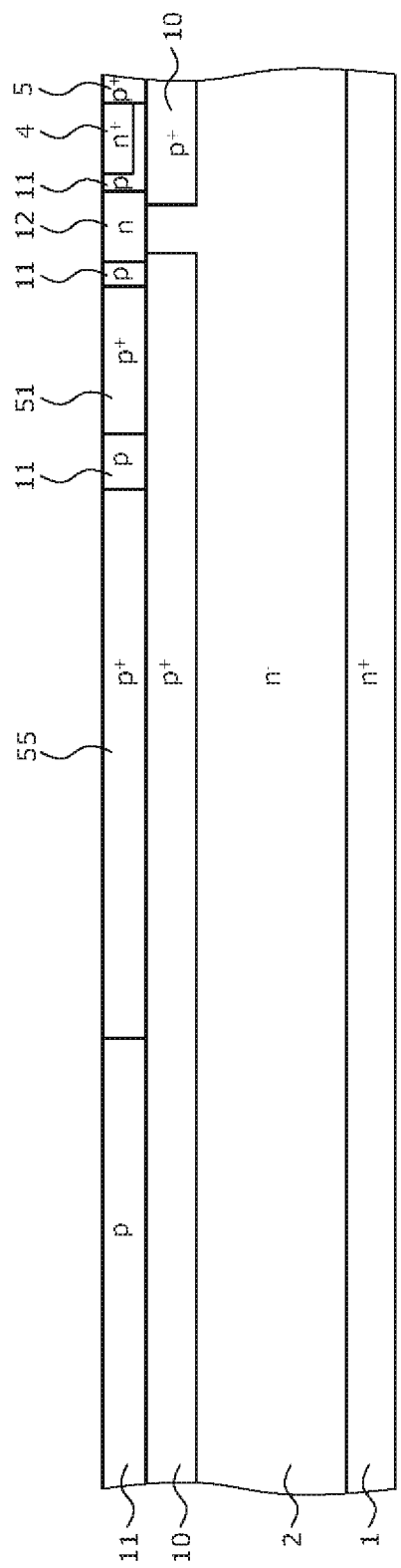
FIG. 6 is a cross-sectional view of the silicon carbide semiconductor device according to the first embodiment during manufacture.

When the p$^+$-type contact region 5 is formed, the p$^+$-type region 51 is formed at the corner part of the active region 101. Further, in the description above, although the p$^+$-type region 51 is formed concurrently with the p$^+$-type contact region 5, the p$^+$-type region 51 may be formed as a separate process. The state up to here is depicted in FIG. 6.

Figure 7:
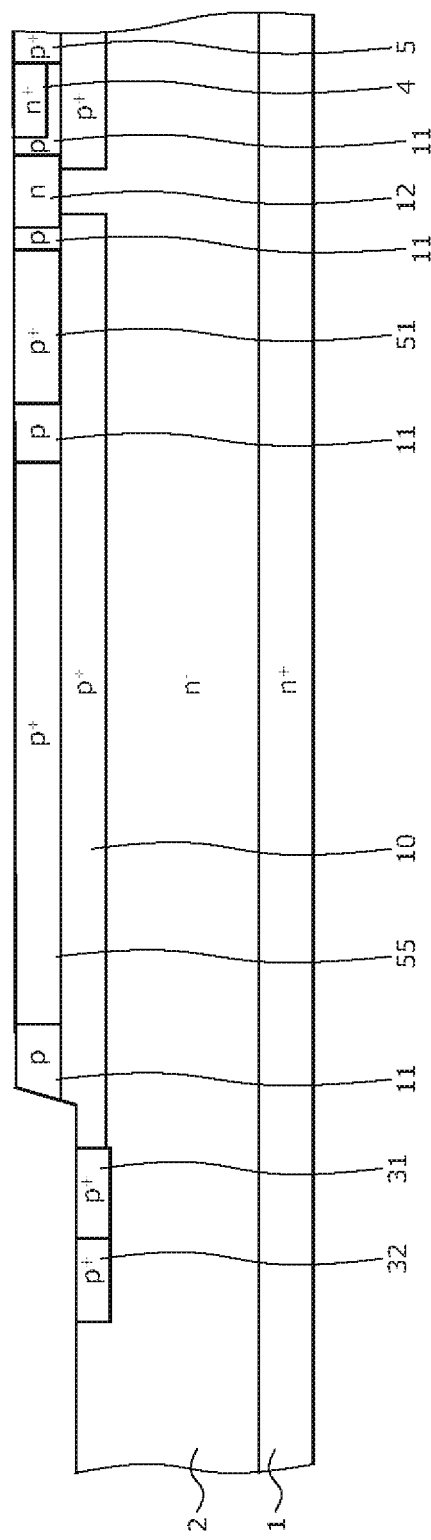
FIG. 7 is a cross-sectional view of the silicon carbide semiconductor device according to the first embodiment during manufacture.

Next, by etching, the outer periphery of the edge termination region 102 is removed by a depth of, for example, 0.7 μm so that the p-type silicon carbide layer 11 remains on the edge termination region 102 and the n⁻-type silicon carbide layer 2 is exposed. Next, in the surface of the exposed n⁻-type silicon carbide layer 2, the JTE1 region 31 and the JTE2 region 32 are selectively formed. Next, heat treatment (annealing) is performed, for example, activating the n⁺-type source region 4, the p⁺-type contact region 5, the n-type well region 12, the p⁺-type base region 10, and the JTE1 region 31 and the JTE2 region 32 of the edge termination region 102. A temperature of the heat treatment, for example, may be about 1620 degrees C. A period of the heat treatment may be, for example, about 2 minutes. The state up to here is depicted in FIG. 7.

Further, a sequence in which the n⁺-type source region 4, the p⁺-type contact region 5, the p⁺-type region 51, and the n-type well region 12 are formed may be variously modified.

Next, on the front surface side of the silicon carbide base, an oxide film constituting a field oxide film 13 is formed by a chemical vapor deposition (CVD) method to have a thickness of 800 nm. The oxide film may be formed by thermal oxidation.

Next, photolithography is performed whereby the field oxide film 13 remains in the edge termination region 102 and the semiconductor layer in the active region 101 is exposed.

Next, the front surface side of the silicon carbide base is subject to thermal oxidation, whereby the gate insulating film 6 is formed having a thickness of 100 nm. The thermal oxidation may be performed in a mixed gas atmosphere of oxygen ($O_2$) and hydrogen ($H_2$), at a temperature of about 1000 degrees C. As a result, the regions formed in the surfaces of the p-type silicon carbide layer 11 and the n⁻-type silicon carbide layer 2 are covered by the gate insulating film 6.

On the gate insulating film 6, a polycrystalline silicon layer doped with, for example, phosphorus atoms (P) is formed as the gate electrode 7. The polycrystalline silicon layer is patterned and selectively removed so that the polycrystalline silicon layer remains on a part of the p-type silicon carbide layer 11 between the n⁺-type source region 4 and the n-type well region 12. At this time, polycrystalline silicon layer may be left on the n-type well region 12.

Next, for example, a phosphate glass (phosphosilicate glass (PSG)) is formed so as to cover the gate insulating film 6 and have a thickness of about 1 μm, whereby the interlayer insulating film 14 is formed. Next, the interlayer insulating film 14 and the gate insulating film 6 are patterned and selectively removed, and a contact hole is formed, exposing the n⁺-type source region 4 and the p⁺-type contact region 5. Thereafter, heat treatment (reflow) is performed, planarizing the interlayer insulating film 14.

Next, the source electrode 8 is selectively formed by photolithography. At this time, the source electrode 8 is embedded in the contact hole and the source electrode 8 is made to be in contact with the n⁺-type source region 4 and the p⁺-type contact region 5.

Figure 8:
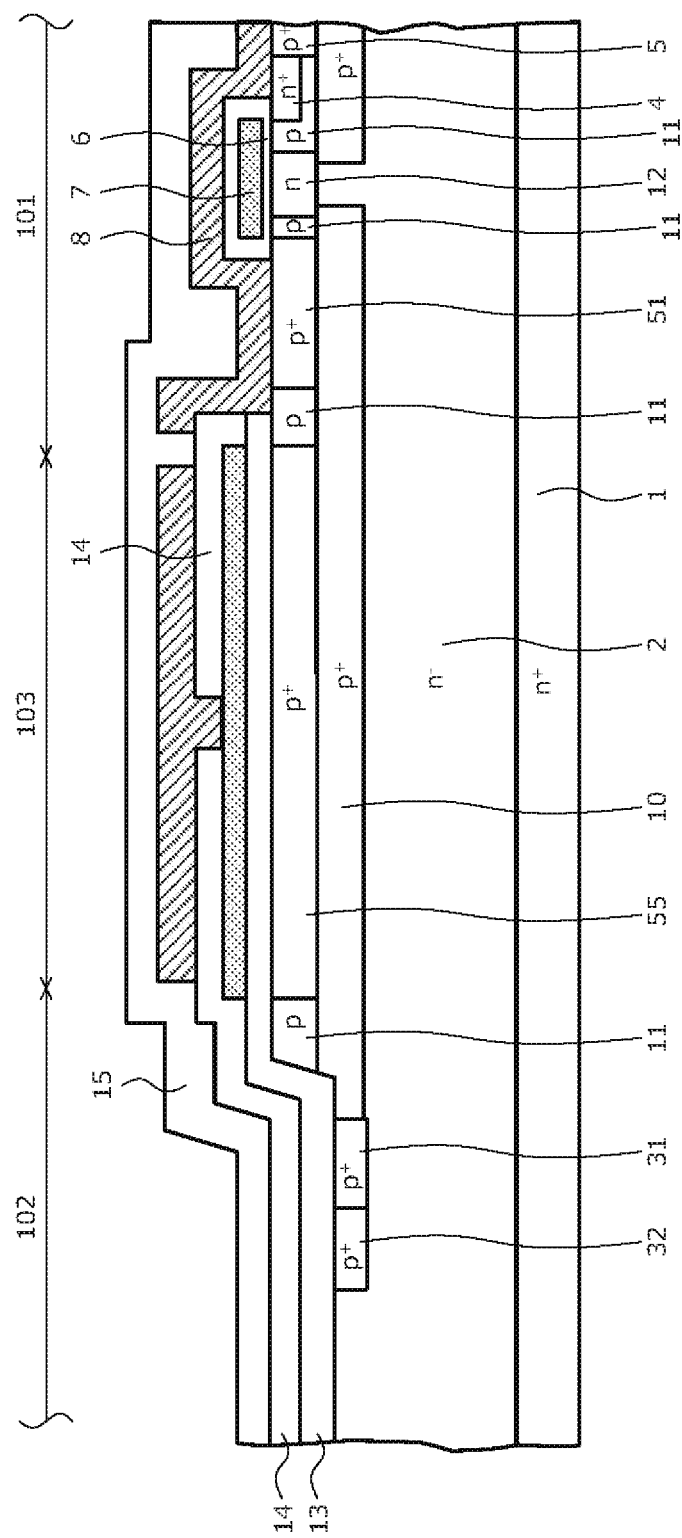
FIG. 8 is a cross-sectional view of the silicon carbide semiconductor device according to the first embodiment during manufacture.

Next, the source electrode 8 is deposited on the entire front surface of the silicon carbide base, for example, by sputtering. A thickness of a part of the source electrode 8 on the interlayer insulating film 14 may be, for example, 5 μm. The source electrode 8 may be formed using, for example, an alloy containing aluminum and 1% ratio of silicon (Al—Si). The state up to here is depicted in FIG. 8.

Next, on a rear surface (rear surface of the n⁺-type silicon carbide substrate 1) of the silicon carbide base, for example, a nickel (Ni) film is formed as the drain electrode 9. Heat treatment at a temperature of 970 degrees C. is performed, forming an ohmic junction between the n⁺-type silicon carbide substrate 1 and the drain electrode 9. Next, on a surface of the drain electrode 9, for example, titanium (Ti), nickel, and gold (Au) are sequentially deposited. Then, on the front surface side of the silicon carbide base, the surface protecting film 15 is formed so as to cover the source electrode 8. Thus, the semiconductor device depicted in FIGS. 1 to 4 is completed.

As described, according to the first embodiment, to pull out charge, a V-type region is provided at a corner part of the active region. Charge (holes) generated at the edge termination region may be pulled out to the source electrode by the p⁺-type region. Thus, a structure results in which no electric field is applied to the oxide film between the p-type silicon carbide layer and the gate electrode around the element, enabling an occurrence of dielectric breakdown to be prevented and reliability to be improved.

Furthermore, the length of the p-type silicon carbide layer, which has a high resistance, is shortened by the p⁺-type region and therefore, the ON resistance of the semiconductor device decreases and current flowing unnecessarily to a body diode in the semiconductor device is reduced, improving reliability.

Figure 9:
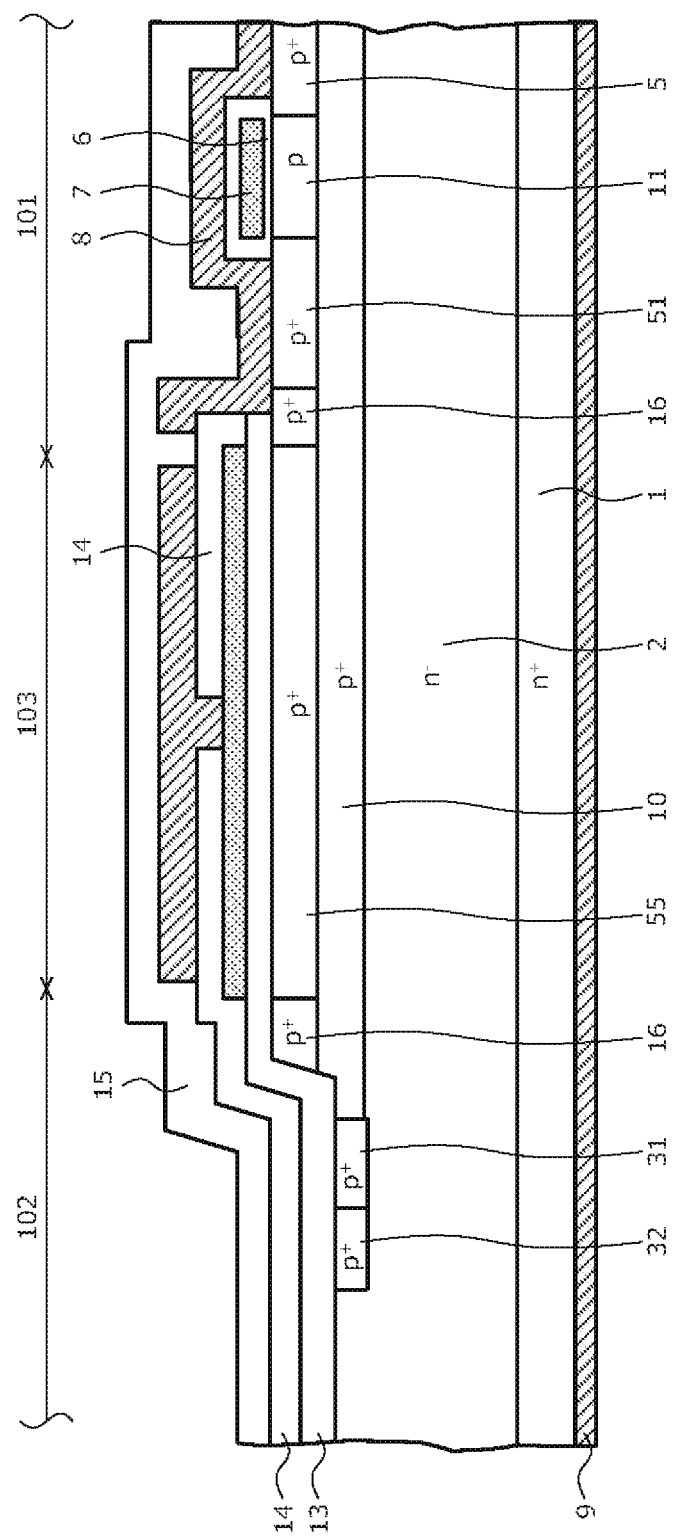
FIG. 9 is a cross-sectional view of a structure of the corner part of the silicon carbide semiconductor device according to a second embodiment depicted in FIG. 12, the cross-sectional view is along cutting line A-A' in FIG. 12.
Figure 10:
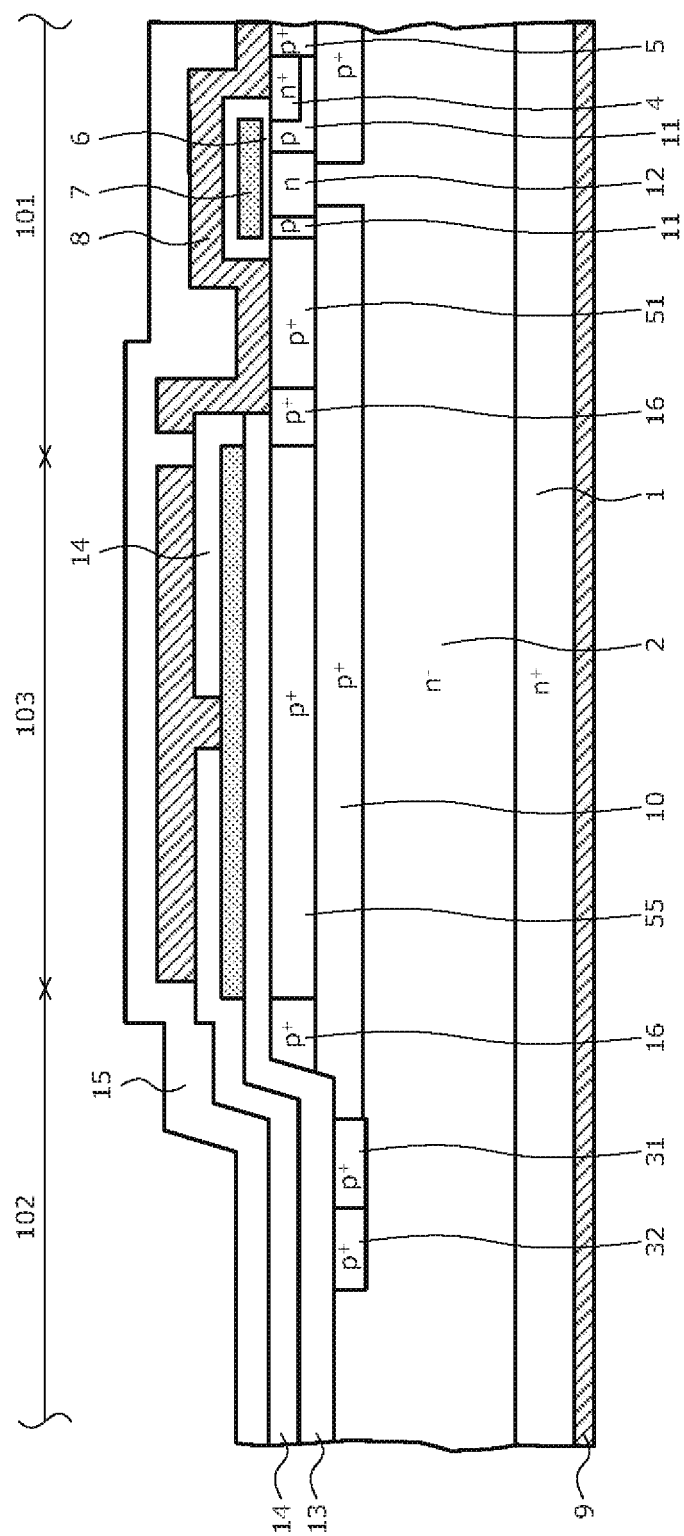
FIG. 10 is a cross-sectional view of the structure of the corner part of the silicon carbide semiconductor device according to the second embodiment depicted in FIG. 12, the cross-sectional view is along cutting line B-B' in FIG. 12.
Figure 11:
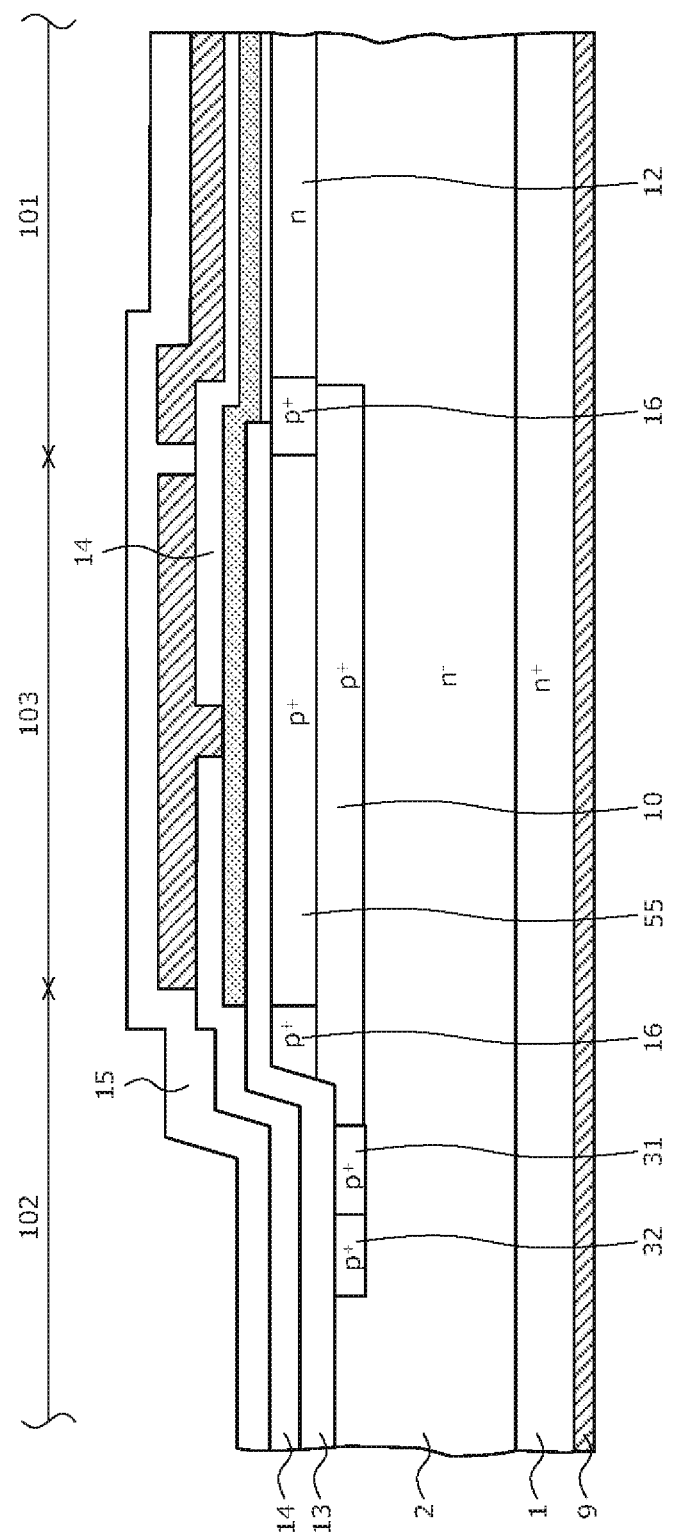
FIG. 11 is a cross-sectional view of the structure of the corner part of the silicon carbide semiconductor device according to the second embodiment depicted in FIG. 12, the cross-sectional view is along cutting line C-C' in FIG. 12.
Figure 12:
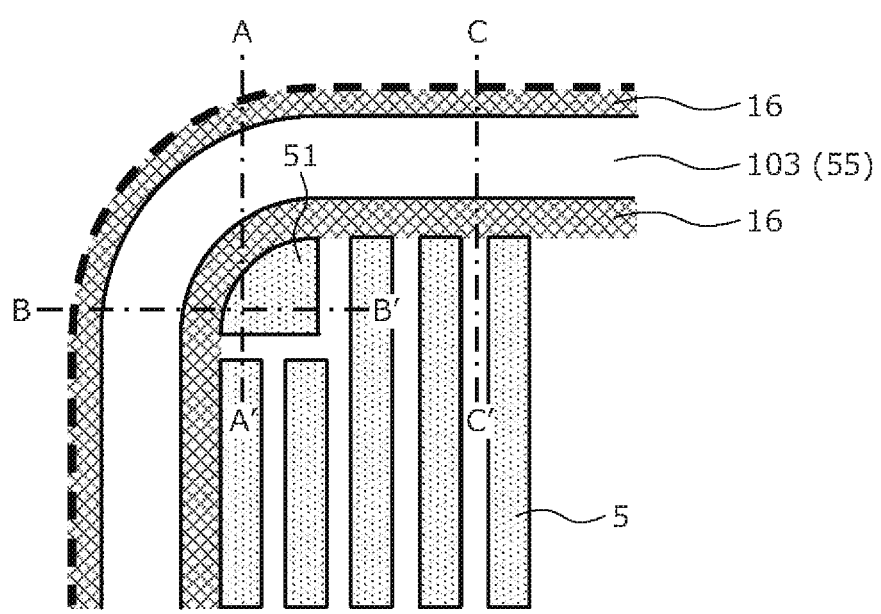
FIG. 12 is a top view of the structure of the corner part of the silicon carbide semiconductor device according to the second embodiment.

FIG. 9 is a cross-sectional view of a structure of the corner part of the silicon carbide semiconductor device according to a second embodiment depicted in FIG. 12, the cross-sectional view is along cutting line A-A' in FIG. 12. FIG. 10 is a cross-sectional view of the structure of the corner part of the silicon carbide semiconductor device according to the second embodiment depicted in FIG. 12, the cross-sectional view is along cutting line B-B' in FIG. 12. FIG. 11 is a cross-sectional view of the structure of the corner part of the silicon carbide semiconductor device according to the second embodiment depicted in FIG. 12, the cross-sectional view is along cutting line C-C' in FIG. 12. FIG. 12 is a top view of the structure of the corner part of the silicon carbide semiconductor device according to the second embodiment.

As depicted in FIGS. 9 to 12, the silicon carbide semiconductor device according to the second embodiment differs from the silicon carbide semiconductor device according to the first embodiment in that a p⁺-type silicon carbide layer 16 is further provided.

The p⁺-type silicon carbide layer 16 is provided in contact with the p⁺-type region 51, the p⁺-type silicon carbide layer 16 contacting a part of the p⁺-type region 51 toward the edge termination region 102. The p⁺-type silicon carbide layer 16 may be further provided in contact with the p⁺-type contact region 55 provided in the gate runner region 103, the p⁺-type silicon carbide layer 16 contacting the p⁺-type contact region 5 on a side of the p⁺-type contact region 5 facing toward the edge termination region 102.

An impurity concentration of the p⁺-type silicon carbide layer 16 is higher than that of the p-type silicon carbide layer 11. For example, an impurity concentration of the p-type silicon carbide layer 11 is on an order of $10^{16}/cm^3$ while that of the p⁺-type silicon carbide layer 16 is on an order of $10^{18}/cm^3$. In this manner, since the p⁺-type silicon carbide layer 16 has a high concentration, resistance is low, enabling ON resistance of the semiconductor device to be reduced.

The method of manufacturing the silicon semiconductor device according to the second embodiment will be described. First, similarly to the first embodiment, processes of preparing the n⁺-type silicon carbide substrate 1 to selectively forming the p⁺-type contact region 5 and the p⁺-type region 51 are sequentially performed (refer to FIGS. 5 and 6).

Next, by photolithography and ion implantation, the p⁺-type silicon carbide layer 16 is formed in the p-type silicon carbide layer 11 of the gate runner region 103. In the ion implantation, a p-type impurity (dopant) such as aluminum may be implanted to achieve a concentration of, for example, $5.0 \times 10^{18}$/cm$^3$. Thereafter, similarly to the first embodiment, an outer periphery of the edge termination region 102 is removed, the n$^-$-type silicon carbide layer 2 is exposed and subsequent processes are sequentially performed (refer to FIGS. 7 and 8), whereby the semiconductor device depicted in FIGS. 9 to 12 is completed.

As described, according to the second embodiment, effects similar to the first embodiment are obtained. Further, since a p$^+$-type silicon carbide layer 16 of an impurity concentration is provided, the length of the p-type silicon carbide layer 11, which has a high resistance, is shortened, resulting in a structure in which the applied electric field is further reduced compared the first embodiment.

Figure 13:
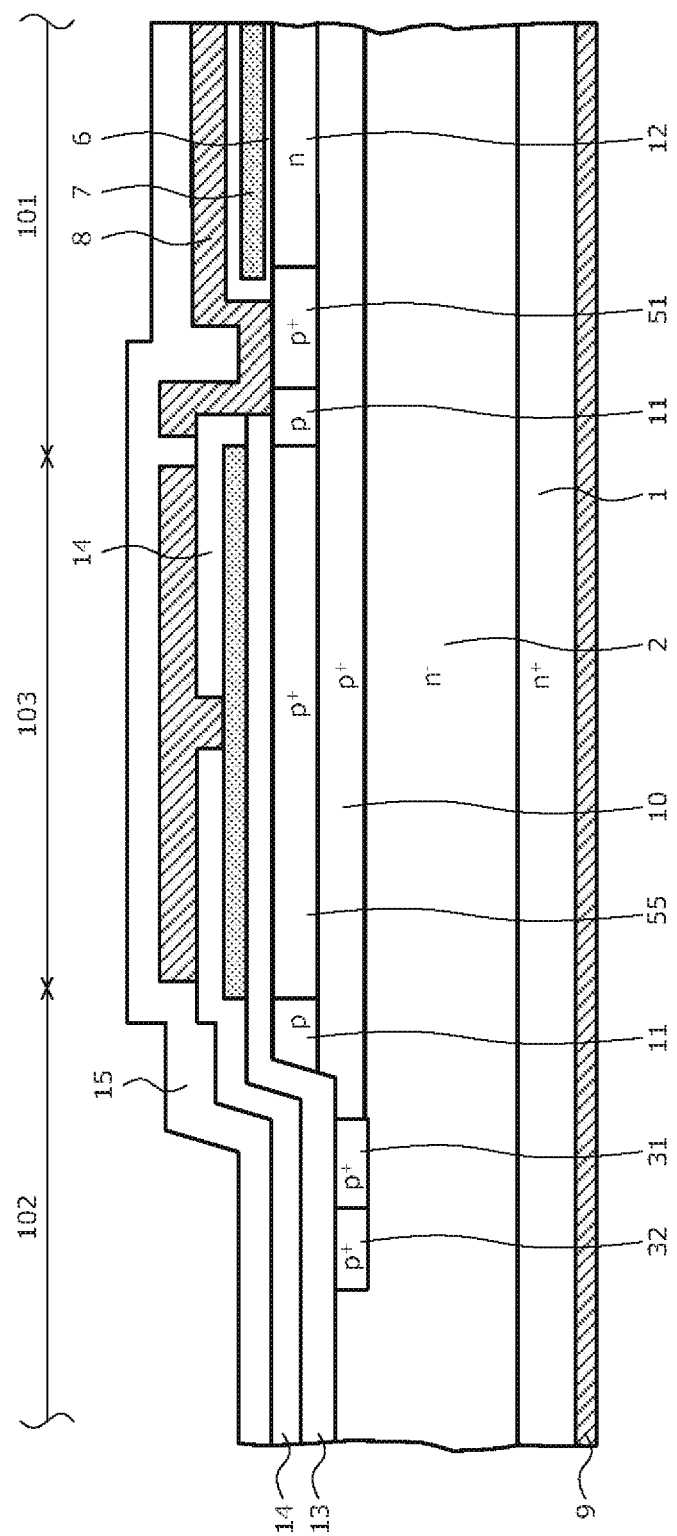
FIG. 13 is a cross-sectional view of a structure of the corner part of the silicon carbide semiconductor device according to a third embodiment depicted in FIG. 14, along a cutting line A-A' in FIG. 14.
Figure 14:
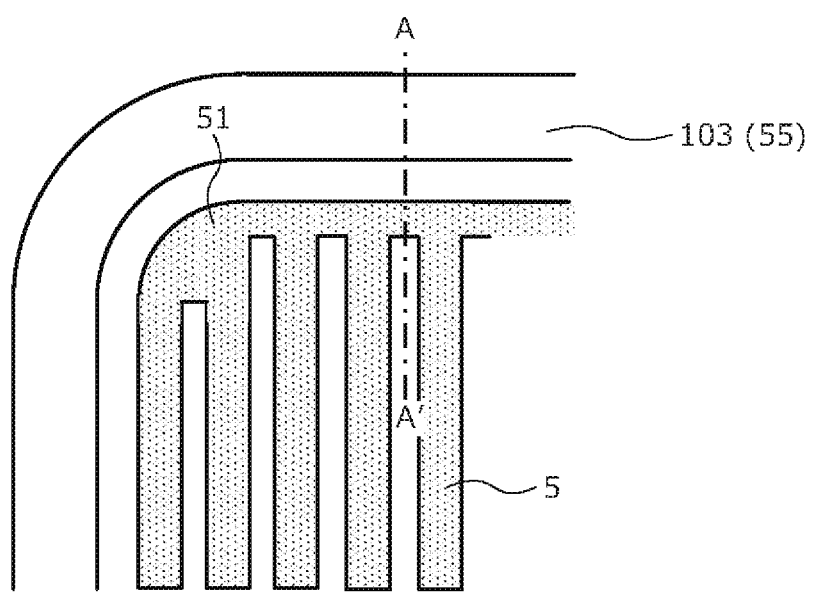
FIG. 14 is a top view of the structure of the corner part of the silicon carbide semiconductor device according to the third embodiment.

FIG. 13 is a cross-sectional view of a structure of the corner part of the silicon carbide semiconductor device according to a third embodiment depicted in FIG. 14, along a cutting line A-A' in FIG. 14. FIG. 14 is a top view of the structure of the corner part of the silicon carbide semiconductor device according to the third embodiment.

As depicted in FIGS. 13 and 14, the silicon carbide semiconductor device according to the third embodiment differs from the silicon carbide semiconductor device according to the first embodiment in that the p$^+$-type region 51 of the corner part of the active region 101 and provided to pull out charge is connected to the p$^+$-type contact region 5 provided in the active region 101. The p$^+$-type region 51 is wider compared the first embodiment and therefore, the resistance is lower than in the first embodiment.

The method of manufacturing the silicon semiconductor device according to the third embodiment will be described. First, similarly to the first embodiment, processes of preparing the n$^+$-type silicon carbide substrate 1 to selectively forming the n$^+$-type source region 4 are sequentially performed (refer to FIG. 5). Next, by photolithography and ion implantation, the p$^+$-type contact region 5 and the p$^+$-type region 51 are selectively formed in a surface layer of a part of the p-type silicon carbide layer 11 on the p$^+$-type base region 10, (refer to FIG. 6).

When the p$^+$-type contact region 5 and the p$^+$-type region 51 are formed, at the corner portion of the active region 101, the p$^+$-type region 51 and the p$_+$-type contact region 5 of the active region 101 are formed so as to be connected (refer to FIG. 14). Further, in the description above, although the p$^+$-type region 51 is formed concurrently with the p$^+$-type contact region 5, formation may be by separate processes. Thereafter, similarly to the first embodiment, the outer periphery of the edge termination region 102 is removed, the n$^-$-type silicon carbide layer 2 is exposed and subsequent processes are sequentially performed (refer to FIGS. 7 and 8), whereby the semiconductor device depicted in FIGS. 13 and 14 is completed.

As described above, according to the third embodiment, effects similar to those of the first embodiment are obtained. In addition, since the p$^+$-type region 51 is wider compared the first embodiment, the resistance is lower than that in the first embodiment and a structure results in which the applied electric field is further reduced compared to the first embodiment.

Figure 15:
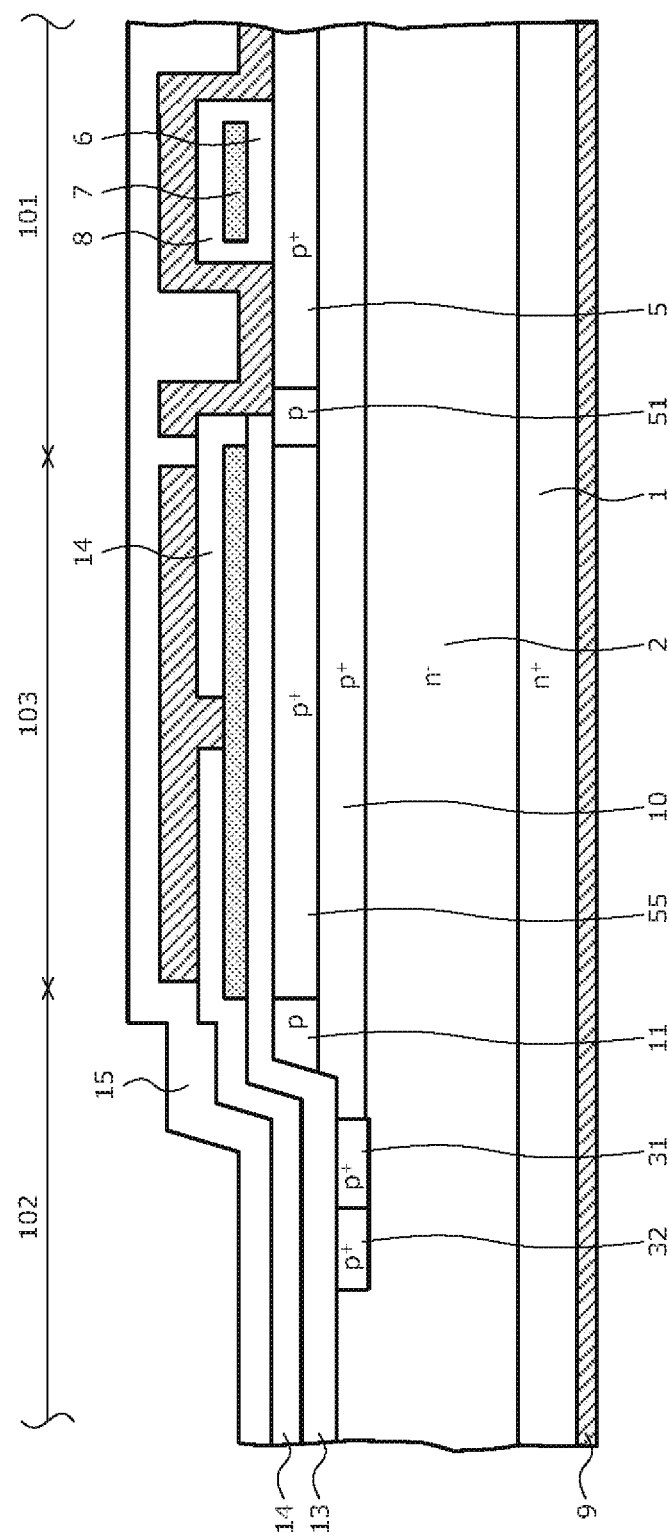
FIG. 15 is a cross-sectional view of a structure of the corner part of the silicon carbide semiconductor device according to a fourth embodiment depicted in FIG. 16, the cross-sectional view is along cutting line A-A' in FIG. 16.
Figure 16:
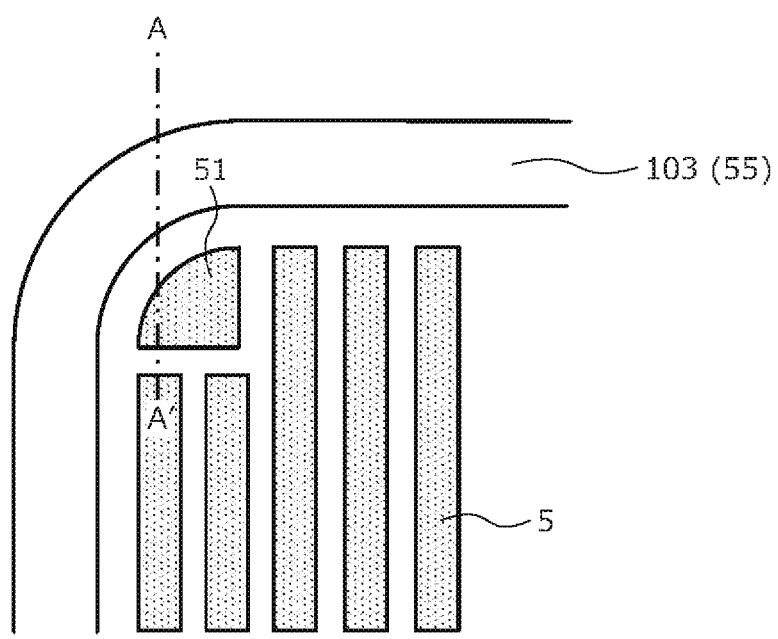
FIG. 16 is a top view of the structure of the corner part of the silicon carbide semiconductor device according to the fourth embodiment.

FIG. 15 is a cross-sectional view of a structure of the corner part of the silicon carbide semiconductor device according to a fourth embodiment depicted in FIG. 16, the cross-sectional view is along cutting line A-A' in FIG. 16. FIG. 16 is a top view of the structure of the corner part of the silicon carbide semiconductor device according to the fourth embodiment.

As depicted in FIGS. 15 and 16, the silicon carbide semiconductor device according to the fourth embodiment differs from the silicon carbide semiconductor device according to the first embodiment in that at the corner part of the active region 101, the gate insulating film 6 is provided on a surface of the p$^+$-type contact region 5. In other words, at the corner part of the active region 101, the p-type silicon carbide layer 11 is not provided directly below the gate electrode 7, and in the part without the p-type silicon carbide layer 11, the resistance of the semiconductor device is reduced.

The method of manufacturing the silicon semiconductor device according to the fourth embodiment will be described. First, similarly to the first embodiment, processes of preparing the n$^+$-type silicon carbide substrate 1 to selectively forming the n$^+$-type source region 4 are sequentially performed (refer to FIG. 5). Next, by photolithography and ion implantation, the p$^+$-type contact region 5 and the p$^+$-type region 51 are selectively formed in a surface layer of a part of the p-type silicon carbide layer 11 on the p$^+$-type base region 10 (refer to FIG. 6).

When the p$^+$-type contact region 5 and the p$^+$-type region 51 are formed, at the corner part of the active region 101, the p$^+$-type contact region 5 is formed without disposal of the p-type silicon carbide layer 11. Thereafter, similarly to the first embodiment, the outer periphery of the edge termination region 102 is removed, the n$^-$-type silicon carbide layer 2 is exposed and subsequent processes are sequentially performed (refer to FIGS. 7 and 8), whereby the semiconductor device depicted in FIGS. 15 and 16 is completed.

As described, according to the fourth embodiment, effects similar to those of the first embodiment are obtained. In addition, at the corner part of the active region 101, since the p-type silicon carbide layer 11 is not provided, the resistance is lower than that in the first embodiment and a structure results in which the applied electric field is further reduced compared the first embodiment.

Figure 17:
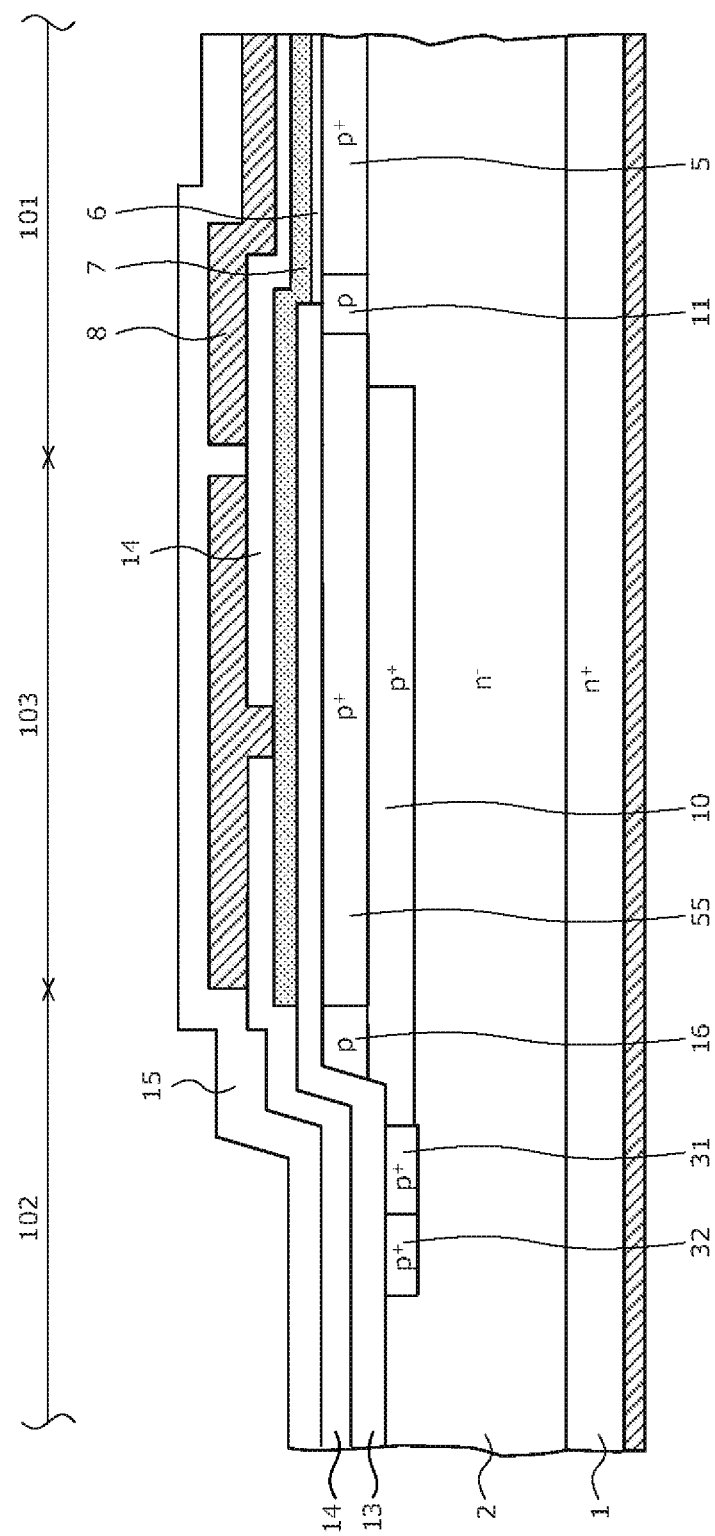
FIG. 17 is a cross-sectional view of a structure of the corner part of the silicon carbide semiconductor device according to a fifth embodiment depicted in FIG. 20, along a cutting line A-A' in FIG. 20.
Figure 18:
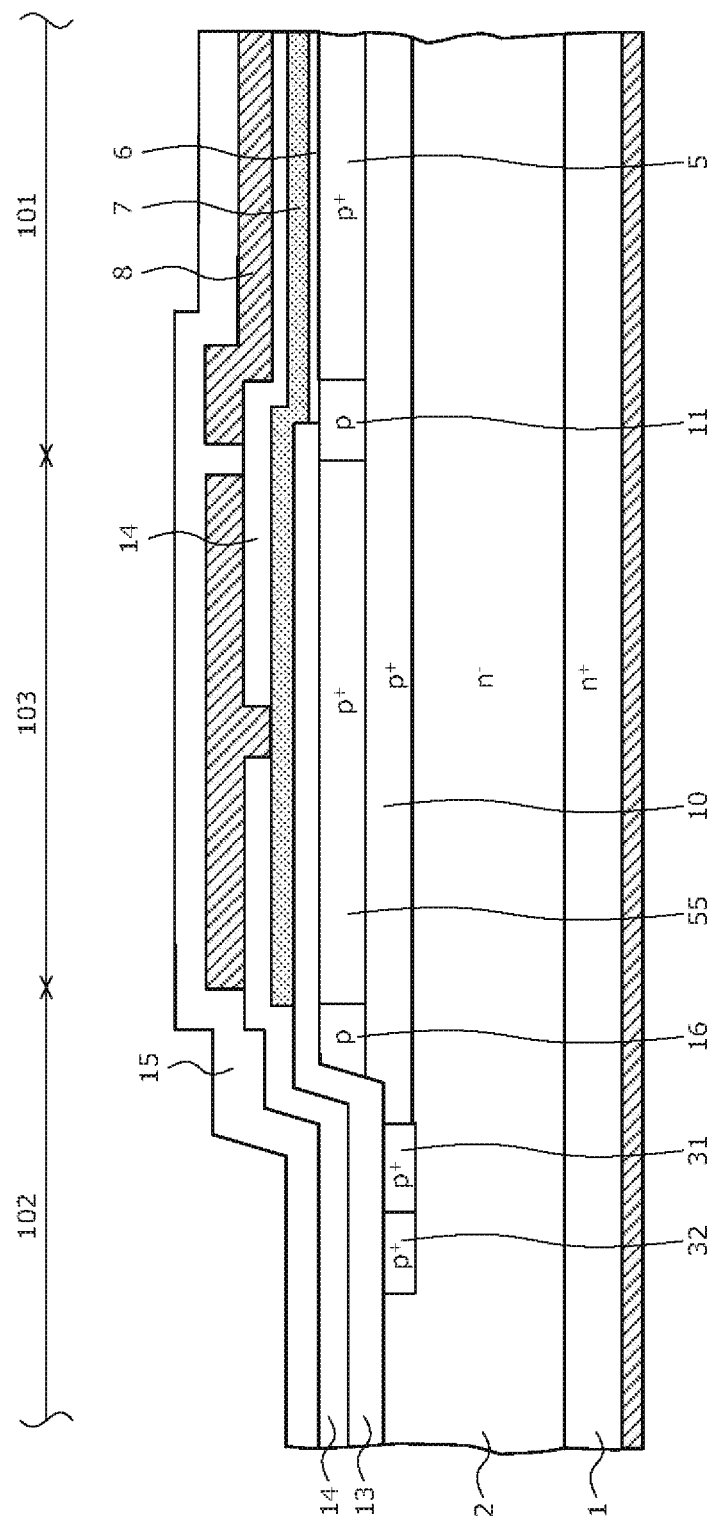
FIG. 18 is a cross-sectional view of the structure of the corner part of the silicon carbide semiconductor device according to the fifth embodiment depicted in FIG. 20, at cutting line B-B' in FIG. 20.
Figure 19:
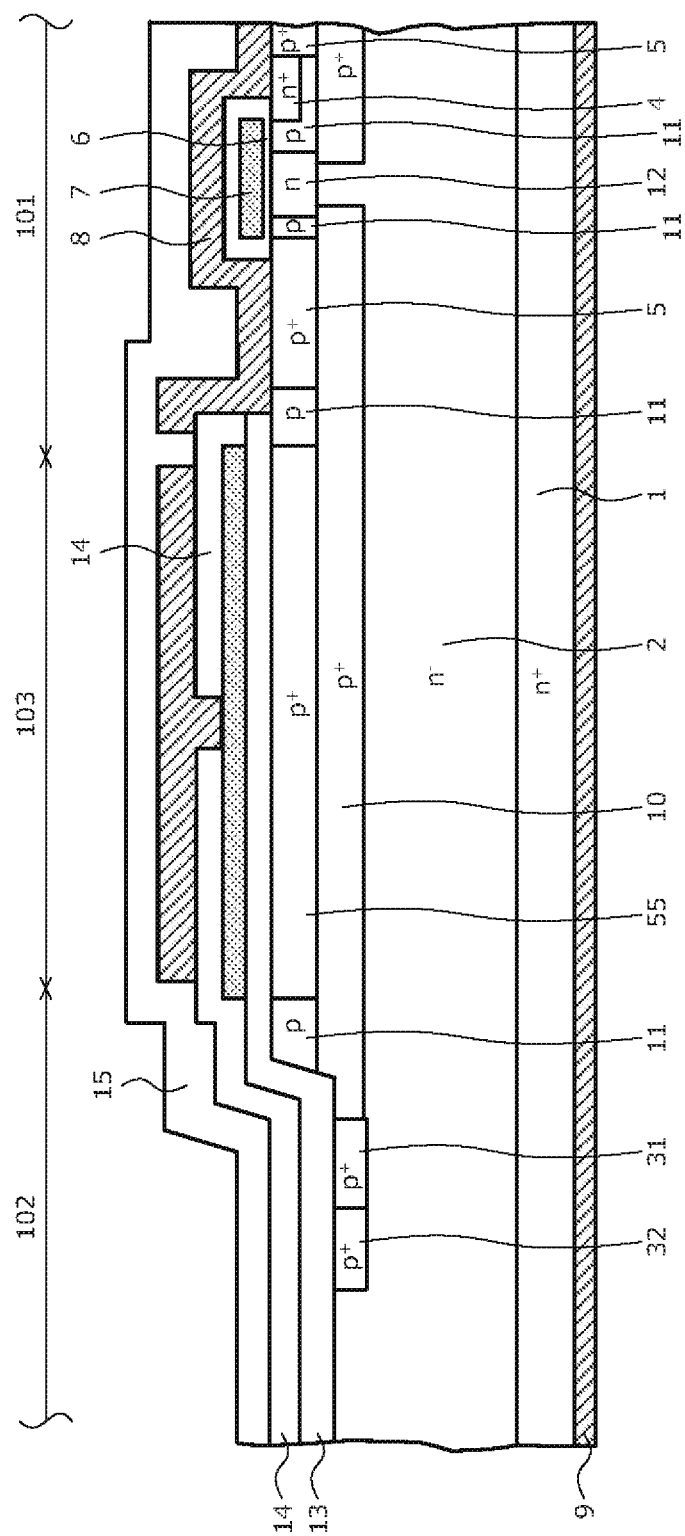
FIG. 19 is a cross-sectional view of the structure of the corner part of the silicon carbide semiconductor device according to the fifth embodiment depicted in FIG. 20, the cross-sectional view is along cutting line C-C' in FIG. 20.
Figures 20, 21:
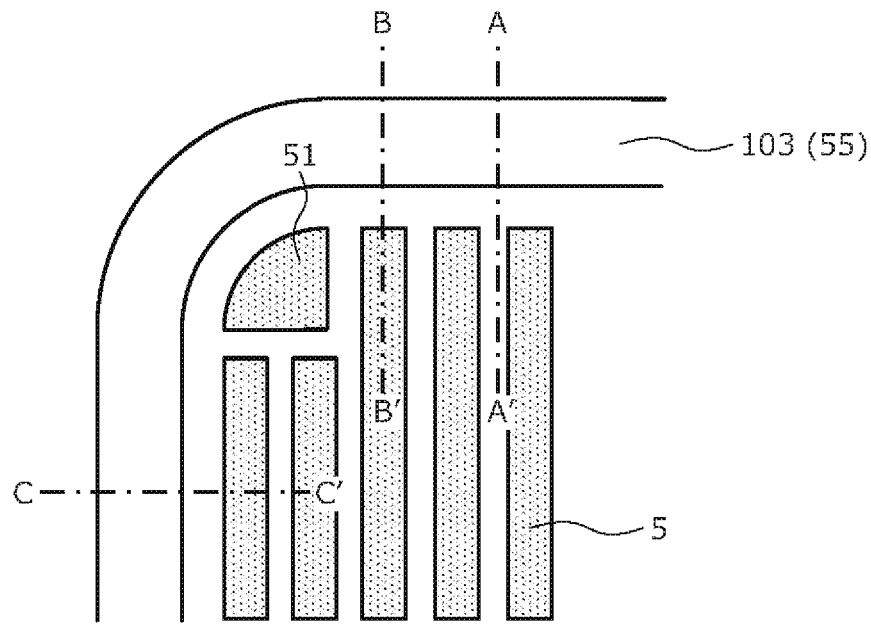
FIG. 20 is a top view of the structure of the corner part of the silicon carbide semiconductor device according to the fifth embodiment.
FIG. 21 is a table depicting results of a reliability test of the silicon carbide semiconductor device according to the first to fifth embodiments and the conventional silicon carbide semiconductor device.

FIG. 17 is a cross-sectional view of a structure of the corner part of the silicon carbide semiconductor device according to a fifth embodiment depicted in FIG. 20, along a cutting line A-A' in FIG. 20. FIG. 18 is a cross-sectional view of the structure of the corner part of the silicon carbide semiconductor device according to the fifth embodiment depicted in FIG. 20, at cutting line B-B' in FIG. 20. FIG. 19 is a cross-sectional view of the structure of the corner part of the silicon carbide semiconductor device according to the fifth embodiment depicted in FIG. 20, the cross-sectional view is along cutting line C-C' in FIG. 20. FIG. 20 is a top view of the structure of the corner part of the silicon carbide semiconductor device according to the fifth embodiment.

As depicted in FIGS. 17 to 20, the silicon carbide semiconductor device according to the fifth embodiment differs from the silicon carbide semiconductor device according to the first embodiment in that at the corner part of the active region 101, the field oxide film 13 is provided, and the p-type silicon carbide layer 11 and the p$^+$-type region 51 are insulated from the gate electrode 7.

In the first embodiment, at the corner part of the active region 101, gate electrode lead wiring electrically connected to the gate electrode 7 is in contact with the p-type silicon carbide layer 11 and the n-type well region 12 (refer to FIG. 3). However, in the fifth embodiment, the field oxide film 13 is provided under the gate electrode lead wiring. As a result, the p-type silicon carbide layer 11 and the n-type well region 12 are insulated from the gate electrode 7 by the field oxide film 13.

The method of manufacturing the silicon semiconductor device according to the fifth embodiment will be described. First, similarly to the first embodiment, processes of preparing the n$^+$-type silicon carbide substrate 1 to forming the field oxide film 13 are sequentially performed (refer to FIGS. 5 to 7). Next, photolithography is performed, whereby the field oxide film 13 remains in the edge termination region 102 and the corner part of the active region 101, and the semiconductor layer other than at the corner part of the active region 101 is exposed. Thereafter, similarly in the first embodiment, the gate insulating film 6 is formed and subsequent processes are sequentially performed, whereby the semiconductor device depicted in FIGS. 17 to 20 is completed.

As described, according to the fifth embodiment, effects similar to those of the first embodiment are obtained. At the corner part of the active region, the p-type silicon carbide layer and the n-type well region are insulated from the gate electrode by the field oxide film 13 and therefore, even when electric field is applied to the oxide film between the p-type silicon carbide layer and the gate electrode around the element, a structure results in which electric breakdown does not occur easily.

FIG. 21 is a table depicting results of a reliability test of the silicon carbide semiconductor device according to the first to fifth embodiments and the conventional silicon carbide semiconductor device. Here, as a reliability test, a high-temperature and high-humidity bias test and a power cycle test of repeatedly turning the power supply on and off were performed for the reliability test periods indicated in FIG. 21. As depicted in FIG. 21, the conventional silicon carbide semiconductor device (conventional example) had a 70% failure rate for 100 h (hours) and a 100% failure rate for 3000 h.

On the other hand, the first embodiment had an 8% failure rate for 100 h (hours) and a 30% failure rate for 3000 h indicating a significant improvement in the failure rate. Further, the second to fifth embodiments further improved the failure rates, where the failure rate for 100 h (hours) was 0% and the failure rates for 3000 h were 5 to 10%. In this manner, although the p$^+$-type region of the first embodiment alone improves the failure rate and reliability, the structures of the second to fifth embodiments further improve reliability.

In the embodiments, although, as an example, a case has been described where a first main surface of the silicon carbide substrate containing silicon carbide is assumed to be a (0001) plane and on the (0001) plane, a MOS gate structure is provided, without limitation hereto, various modifications are possible such as in the type of wide bandgap semiconductor material (e.g., gallium nitride (GaN)), orientation of the substrate main surface, etc. Further, in the embodiments, although the first conductivity type is assumed to be an n and the second conductivity type is assumed to be a p-type, the present invention is further implemented when the first conductivity type is a p-type and the second conductivity type is an n-type.

According to the embodiments, the p$^+$-type region (fifth semiconductor sub-region of the second conductivity type) is provided at the corner part of the active region to pull out charge. Thus, charge (holes) generated at the edge termination region may be pulled out to the source electrode by the p$^+$-type region. As a result, a structure is achieved in which the electric field applied to the oxide film between the p-type silicon carbide layer and the gate electrode around the element is reduced and the occurrence of dielectric breakdown is prevented, enabling reliability to be improved.

Further, the length of the p-type silicon carbide layer, which has a high resistance, is shortened due to the p$^+$-type region and therefore, the ON resistance of the semiconductor device is reduced and current flowing unnecessarily to a body diode in the semiconductor device is reduced, improving reliability.

The silicon carbide semiconductor device and the method of manufacturing a silicon carbide semiconductor device of the present invention achieve an effect in that electric field at the oxide film between the p-type silicon carbide layer, which has a high resistance, and the gate electrode around the element is mitigated, and an occurrence of dielectric breakdown caused by charge (holes) generated at the edge termination region is prevented, enabling reliability to be improved.

As described, the semiconductor device and the method of manufacturing a semiconductor device of the present invention are useful for semiconductor devices used as switching devices and are particularly suitable for vertical MOSFETs that use a wide bandgap semiconductor material.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having an active region in which a main current flows, comprising:
   a silicon carbide semiconductor substrate of a first conductivity type;
   a first semiconductor layer of the first conductivity type provided on a front surface of the silicon carbide semiconductor substrate, an impurity concentration of the first semiconductor layer being lower than an impurity concentration of the silicon carbide semiconductor substrate;
   a first semiconductor region of a second conductivity type selectively provided in a surface of the first semiconductor layer;
   a second semiconductor layer provided on the surface of the first semiconductor layer and a surface of the first semiconductor region;
   a first semiconductor sub-region of the second conductivity type provided in the second semiconductor layer;
   a second semiconductor sub-region of the first conductivity type selectively provided on the first semiconductor layer, in the second semiconductor layer;
   third semiconductor sub-regions of the first conductivity type selectively provided in the second semiconductor layer;
   a fourth semiconductor sub-region of the second conductivity type provided between two of the third semiconductor sub-regions in the second semiconductor layer, an impurity concentration of the fourth semiconductor sub-region being higher than an impurity concentration of the first semiconductor sub-region of the second semiconductor layer;
   a fifth semiconductor sub-region of the second conductivity type provided in the second semiconductor layer at a corner part of an active region in a plan view of the device, the fifth semiconductor sub-region being free of contact with the third semiconductor regions;
   a first electrode electrically connected to the third semiconductor sub-regions and the fourth semiconductor sub-region;

a gate insulating film provided on an area of a surface of the second semiconductor layer in which two of the third semiconductor sub-regions sandwich the second semiconductor sub-region;

a gate electrode provided on the gate insulating film; and a second electrode provided on a rear surface of the silicon carbide semiconductor substrate, wherein the impurity concentration of the first semiconductor sub-region of the second semiconductor layer is at most $5 \times 10^{16}/cm^3$, and an impurity concentration of the fifth semiconductor sub-region is higher than the impurity concentration of the first semiconductor sub-region of the second semiconductor layer.

2. The silicon carbide semiconductor device according to claim 1, further comprising a sixth semiconductor sub-region in contact with a part of the fifth semiconductor sub-region, the part of the fifth semiconductor sub-region facing toward an edge termination region that surrounds a periphery of the active region.

3. The silicon carbide semiconductor device according to claim 1, wherein the fifth semiconductor sub-region is in contact with the fourth semiconductor sub-region, at the corner part of the active region.

4. The silicon carbide semiconductor device according to claim 1, wherein the gate insulating film is provided on a surface of the fourth semiconductor sub-region, at the corner part of the active region.

5. The silicon carbide semiconductor device according to claim 1, wherein the gate electrode is insulated from the second semiconductor layer and the fifth semiconductor sub-region by a field oxide film, at the corner part of the active region.

6. A method of manufacturing a silicon carbide semiconductor device having an active region in which the main current flows, the method comprising:

forming a first semiconductor layer of a first conductivity type on a front surface of a silicon carbide semiconductor substrate of the first conductivity type, an impurity concentration of the first semiconductor layer being lower than an impurity concentration of the silicon carbide semiconductor substrate;

selectively forming a first semiconductor region of a second conductivity type in a surface of the first semiconductor layer;

forming a second semiconductor layer of the second conductivity type on the surface of the first semiconductor layer and a surface of the first semiconductor region, an impurity concentration of the second semiconductor layer being at most $5 \times 10^{16}/cm^3$;

selectively forming a second semiconductor sub-region of the first conductivity type on the first semiconductor layer, in the second semiconductor layer, to form a first semiconductor sub-region of the second conductivity type and the second semiconductor sub-region of the first conductivity type in the second semiconductor layer;

selectively forming third semiconductor sub-regions of the first conductivity type in the second semiconductor layer;

forming a fourth semiconductor sub-region of the second conductivity type between the third semiconductor sub-regions in the second semiconductor layer, an impurity concentration of the fourth semiconductor sub-region being higher than an impurity concentration of the first semiconductor sub-region of the second semiconductor layer;

forming a first electrode electrically connected to the third semiconductor sub-regions and the fourth semiconductor sub-region;

forming a gate insulating film on the second semiconductor sub-region;

forming a gate electrode on the gate insulating film; and forming a second electrode on a rear surface of the silicon carbide semiconductor substrate, wherein forming the fourth semiconductor sub-region includes forming a fifth semiconductor sub-region of the second conductivity type at a corner part of the active region, the fifth semiconductor sub-region being free of contact with the third semiconductor regions, an impurity concentration of the fifth semiconductor sub-region being higher than the impurity concentration of the first semiconductor sub-region of the second semiconductor layer.

7. The silicon carbide semiconductor device according to claim 1, wherein the second semiconductor sub-region is disposed between an adjacent two of the third semiconductor sub-regions, and the fourth semiconductor sub-region is disposed between another adjacent two of the third semiconductor sub-regions.

8. The method of manufacturing a silicon carbide semiconductor device according to claim 6, wherein forming a second semiconductor sub-region includes forming the second semiconductor sub-region to be disposed between an adjacent two of the third semiconductor sub-regions, and forming a fourth semiconductor sub-region includes forming the fourth semiconductor sub-region to be disposed between another adjacent two of the third semiconductor sub-regions.

* * * * *